United States Patent [19]
Arakawa et al.

[11] Patent Number: 5,951,720
[45] Date of Patent: Sep. 14, 1999

[54] IC MOUNTING/DEMOUNTING SYSTEM AND MOUNTING/DEMOUNTING HEAD THEREFOR

[75] Inventors: Isao Arakawa; Yoshinori Hirata, both of Kumamoto, Japan

[73] Assignee: Mitsubishi Denki Kabushiki Kaisha, Tokyo, Japan

[21] Appl. No.: 08/898,841

[22] Filed: Jul. 23, 1997

[30]     Foreign Application Priority Data

Dec. 2, 1996  [JP]  Japan ..................................... 8-321749

[51] Int. Cl.⁶ ....................................................... H05K 3/30
[52] U.S. Cl. ......................... 29/25.01; 29/592.1; 29/836; 29/837; 414/752
[58] Field of Search ................... 29/593, 592.1, 29/25.01, 832, 836, 837; 324/755, 754, 758; 414/752

[56]         References Cited

U.S. PATENT DOCUMENTS 4,770,599  9/1988  Hawkswell .............................. 414/752
5,415,331  5/1995  Lin ........................................... 228/213
5,650,732  7/1997  Sakai ........................................ 324/755

FOREIGN PATENT DOCUMENTS

| 4338852 | 5/1995 | Germany . |
| 4406771 | 9/1995 | Germany . |
| 19518062 | 12/1995 | Germany . |
| 19644509 | 4/1997 | Germany . |
| 19626505 | 1/1998 | Germany . |

Primary Examiner—Donald L. Monin, Jr.
Assistant Examiner—Michael Dietrich
Attorney, Agent, or Firm—Leydig, Voit & Mayer

[57]               ABSTRACT

An IC mounting/demounting system in which a centering tool 27 including a socket pusher 27c and a centering recess portion 27b constructed integrally with the tool is detachably attached to a head body 57. Also provided is a centering tool stocker for supporting a plurality of centering tools. This construction eliminates the need for the replacement of a mounting/demounting head with each change of the kind of IC, thus enhancing working efficiency.

11 Claims, 22 Drawing Sheets

FIG. 17
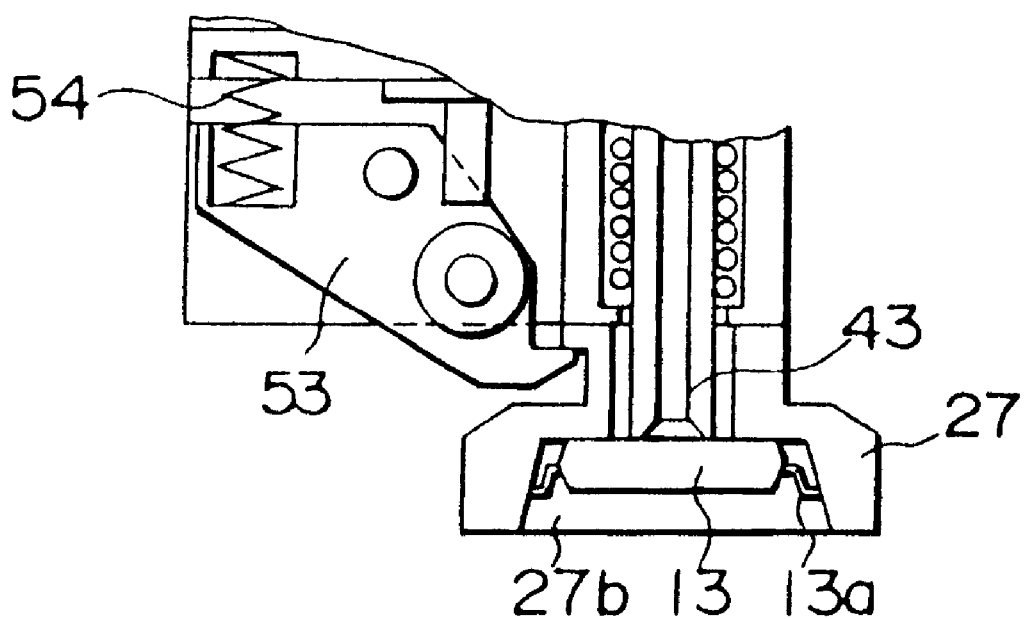
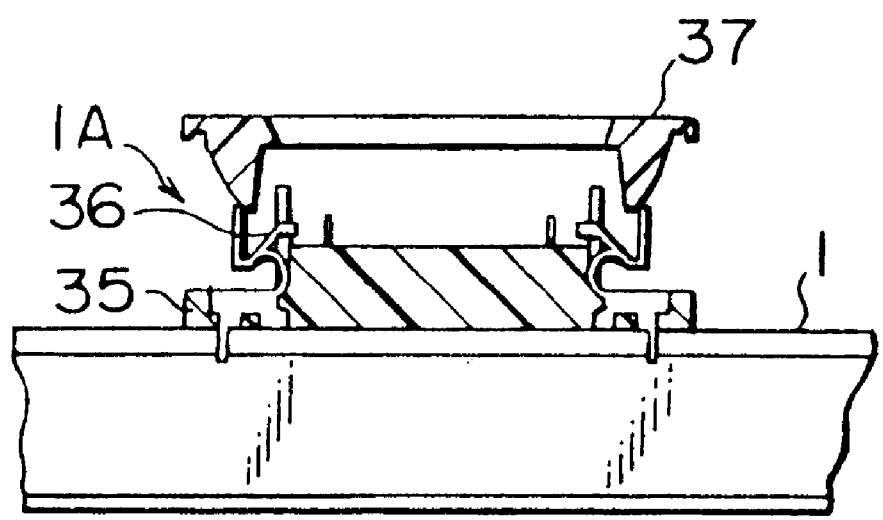

IC MOUNTING/DEMOUNTING SYSTEM AND MOUNTING/DEMOUNTING HEAD THEREFOR

BACKGROUND OF THE INVENTION

1. Field of the Invention

The present invention relates to an IC mounting/demounting system for transferring an IC on a tray and mounting the IC on an IC socket on a socket board for a burn-in process or demounting the IC from the IC socket and transferring the IC on the tray.

2. Description of the Related Art

Conventionally, a fabricated IC (IC package) passes through a burn-in process turned on for a predetermined time at a high temperature of, for example, 120 to 130° C. and thereafter, undergoes an electrical operation test.

In the burn-in process, an IC is mounted on each of a plurality of IC sockets arranged on a socket board, that is, the IC is electrically connected with the IC socket, and the socket board is set in a burn-in oven. Therefore, a process for transferring an IC to an IC socket on a socket board and mounting/demounting the IC on or from the IC socket is necessary before and after the burn-in process and an IC mounting/demounting system is used for the process.

FIG. 27 is a perspective view showing an example of a conventional IC mounting/demounting system. In the figure, a socket board (burn-in board) 1 on which a plurality of IC sockets (not illustrated) are mounted is transferred one by one from a board magazine 3 by a board transfer section 2. A tray housing section 5 in which a plurality of trays 4 are housed is set nearby the board transfer section 2. A plurality of IC's (not illustrated) are mounted on each tray 4.

The IC's are transferred between the socket board 1 and the tray 4 by a robot body 6. Two mounting/demounting heads 7 for sucking and holding the IC's are mounted on the robot body 6. The interval between these two mounting/demounting heads 7 can be adjusted in accordance with the pitch between the IC sockets on the socket board 1 and the pitch between the IC's housed in the tray 4. Moreover, a tray chuck 8 for transferring the tray 4 is mounted on the robot body 6.

Next, the operation will now be described. For example, to mount the IC's on the tray 4 housed in the tray housing section 5 on the IC sockets on the socket board 1, the mounting/demounting heads 7 are moved onto the IC on the tray 4 by the robot body 6 to suck and hold two IC's. Thereafter, the mounting/demounting heads 7 are moved over the IC sockets on the socket board 1 to mount the IC on the IC sockets and cancel the suction.

In this case, because the IC socket is provided with a cover for opening/closing the contacts, the IC is set to the IC socket by pressing the cover with the mounting/demounting head and thereby opening the contacts. Then, by moving the mounting/demounting head 7 upward, the pressure on the cover is released, the contacts are closed, and the IC is held by the IC socket. Moreover, the IC is positioned in the mounting/demounting head 7 by correcting the shoulder portions of the IC by chucks (not illustrated) from four directions.

Thus, the IC's are mounted by two on the IC sockets on the socket board 1 from the tray 4. When an IC is mounted on every IC socket on the socket board 1, the next socket board 1 is supplied by the board transfer section 2. When all the IC's are removed from the tray 4, a new tray 4 is supplied by the tray chucking section 8.

As described above, a burn-in process is carried out after the socket board with the IC's mounted on the IC sockets is placed in a burn-in oven (not illustrated). After the burn-in process, the IC's on the IC sockets are transferred to the tray 4 by reversing the above procedure.

In the conventional IC mounting/demounting system constructed as described above, it is necessary to position the IC by the chucks and press the cover of the IC socket by socket pushers (not illustrated) of the mounting/demounting head when the IC is mounted and demounted on the IC socket. However, because various sizes of IC sockets are used corresponding to the IC to be mounted, it is necessary to store various mounting/demounting heads having a socket pusher corresponding to each IC socket size and the chucks corresponding to the IC size and to replace the whole of the mounting/demounting head whenever the type of IC and IC socket are changed. To perform the above mounting/demounting head replacement, operations of the system must be stopped for 15 to 20 minutes or more thereby lowering operation efficiency. Particularly, as the number of diversified low-volume products increases, the frequency of mounting/demounting head replacement increases and the time and labor required for the replacement greatly influence operation efficiency.

There is a system for simultaneously transferring a lot of IC's by a robot having a plurality of mounting/demounting heads corresponding to only IC's and IC sockets of specific sizes. However, the system is also unsuitable for the above diversified low-volume product manufacture because the whole system must be stopped while the different size IC's and IC sockets are handled.

SUMMARY OF THE INVENTION

The present invention has been achieved with a view toward solving the problems described above, and it is an object of the present invention to provide an IC mounting/demounting system which is capable of greatly improving the operation efficiency by eliminating the mounting/demounting head replacement time.

To this end, according to one aspect of the present invention, there is provided an IC mounting/demounting system comprising: a tray supply section for supplying a tray which bears a plurality of IC's thereon; a socket board supply section for supplying a socket board having a plurality of IC sockets to and from which the IC's are mounted and demounted by pressing and displacement of a movable section; a robot body for transferring said IC's between the tray supplied to the tray supply section and the socket board supplied to the socket board supply section; a mounting/demounting head equipped with a centering tool including a head body supported by the robot body for sucking and holding the IC, a socket pusher detachably supported by the head body and a centering recess portion for centering the IC which are constructed integrally with the head; a centering tool stocker on which a plurality of centering tools having different sizes are mountable; and a control section for controlling an operation of the robot body.

According to another aspect of the present invention, there is provided a mounting/demounting head of an IC mounting/demounting system comprising: a head body supported by a robot body for sucking and holding an IC; and a centering tool including a socket pusher detachably supported by the head body for pressing a movable portion of an IC socket at mounting and demounting of the IC to and from said IC socket and a centering recess portion for centering said IC, which are constructed integrally with the tool.

According to a still further aspect of the present invention, there is provided an IC mounting/demounting system comprising:

a tray supply section for supplying a tray which bears a plurality of IC's thereon; a socket board supply section for supplying a socket board having a plurality of IC sockets; a robot body for transferring the IC's between the tray supplied to the tray supply section and the socket board supplied to the socket board supply section; a mounting/demounting head made so that its position is adjustable in accordance with a size of the IC socket, equipped with a defective indication detecting sensor for detecting a defective indication attached onto said IC socket, and supported by the robot body for sucking and holding the IC; and a control section for controlling an operation of said robot body.

BRIEF DESCRIPTION OF THE DRAWINGS

FIG. 17 is a cross-sectional view showing a state where the FIG. 16 mounting/demounting head is shifted upwardly;

DESCRIPTION OF THE PREFERRED EMBODIMENTS

Embodiments of the present invention will be described hereinbelow with reference to the drawings.

First Embodiment

Figure 1:
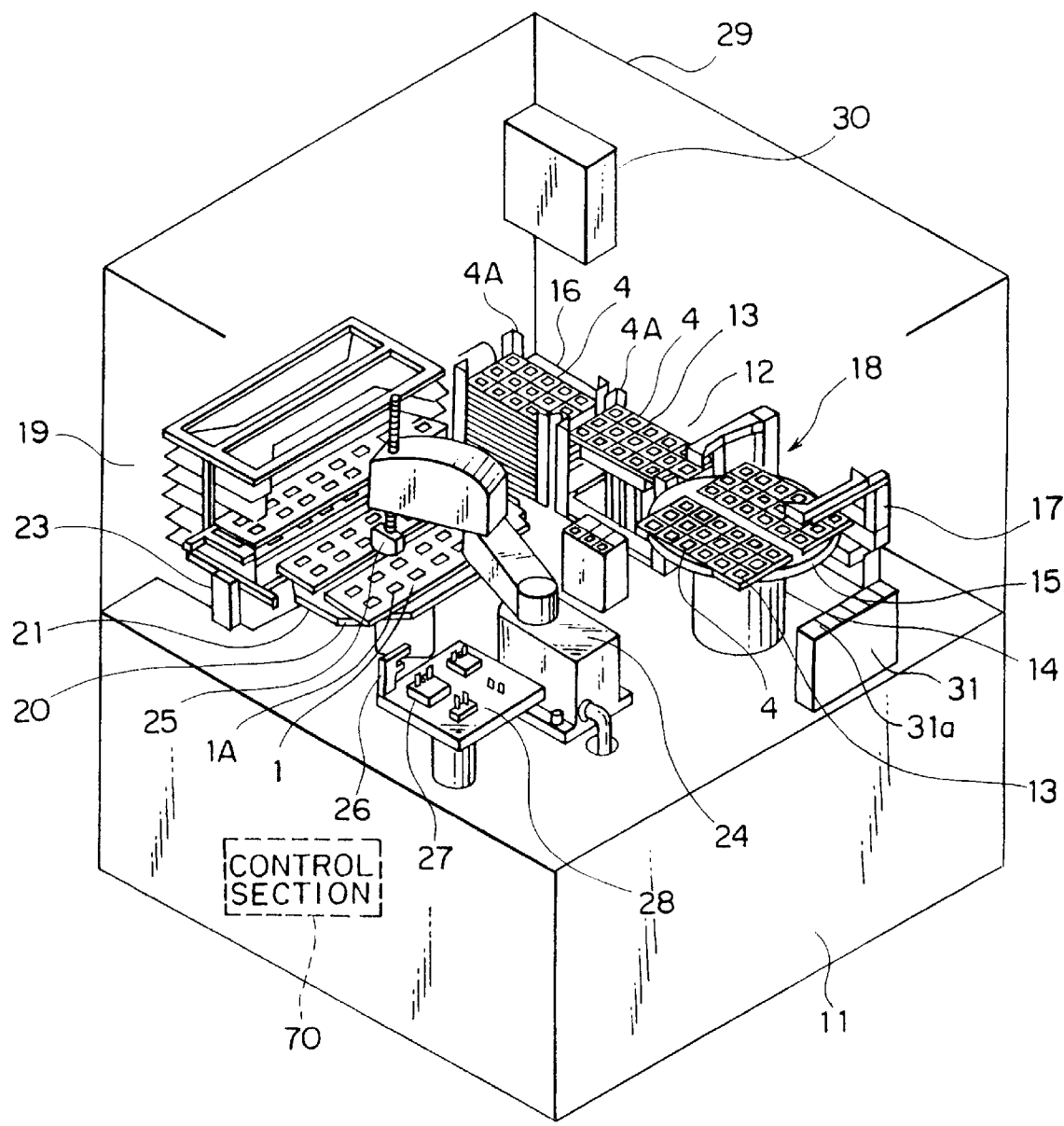
FIG. 1 is a perspective view showing an IC mounting/demounting system according to a first embodiment of the present invention.
Figure 2:
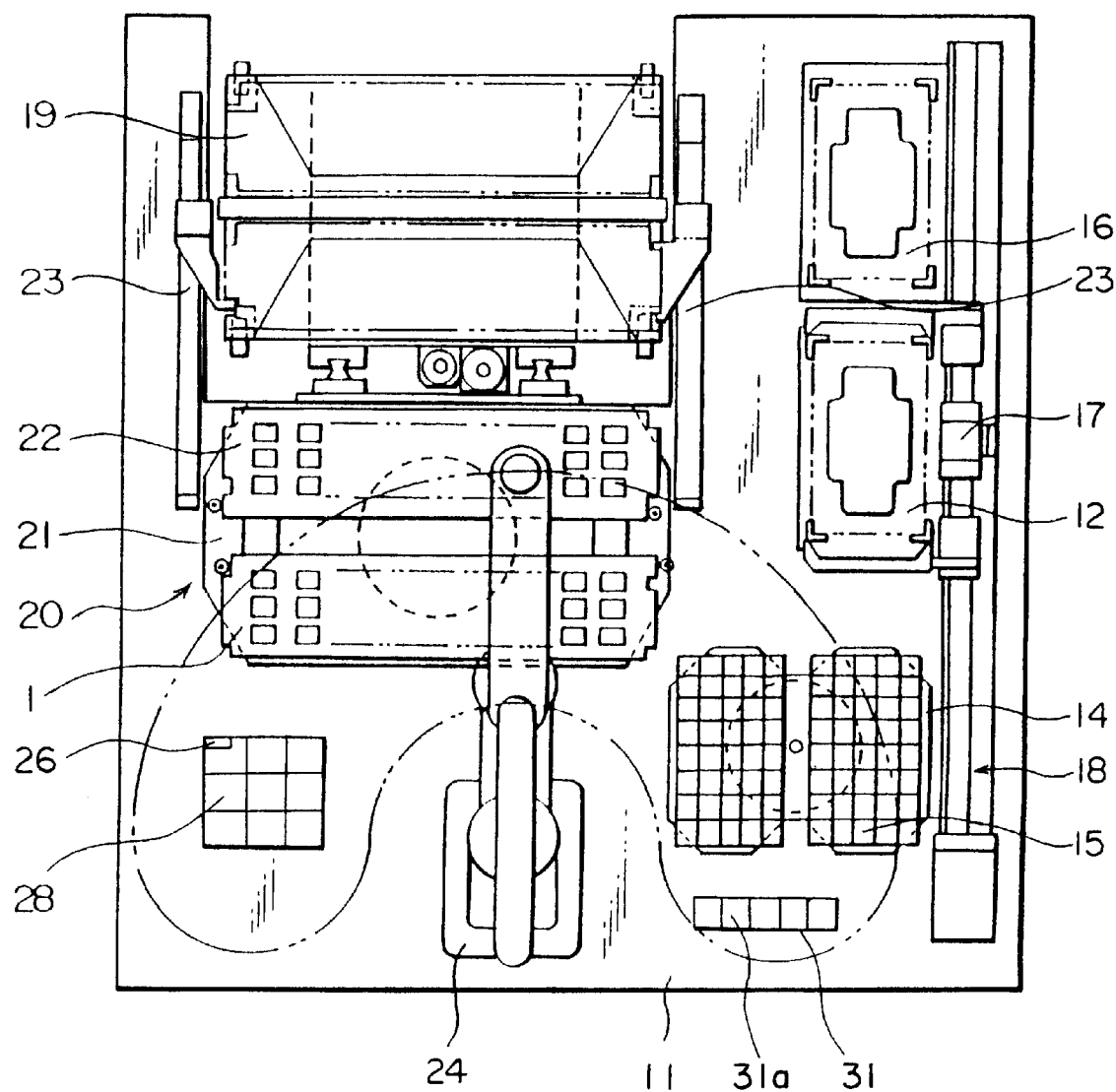
FIG. 2 is a plan view showing the FIG. 1 system.

FIG. 1 is a perspective view showing an IC mounting/demounting system according to a first embodiment of this invention, and FIG. 2 is a plan view showing the FIG. 1 system. On an installation base 11 there are placed two tray lifting devices 12, 16 for gradually lifting and supplying a plurality of trays 4 piled up. Each of the trays 4 is structurally made to position and carry a plurality of IC's (IC package) 13.

A tray table 14 to which the trays 4 are transferred from the tray lifting device 12 or 16 is provided to be adjacent to one side of the tray lifting device 12. This tray table 14 is equipped with a tray bearer 15 rotatable and made to support two trays 4, and the two trays 4 on the tray bearer 15 are interchangeable in position in a manner that the tray bearer 15 is rotated by 180 degrees. A tray conveying device 17 takes charge of the transportation of the trays 4 between the tray lifting devices 12, 16 and the tray table 14. Further, the tray lifting devices 12, 16, the tray table 14 and the tray conveying device 17 constitute a tray supply section 18.

A socket board rack 19, accommodating a plurality of socket boards (burn-in socket boards) 1 so that they are liftable, is joined at a given position on the installation base 11. In addition, provided on the installation base 11 is a socket board table 20 serving as a socket board supply section. This socket board table 20 is provided with a socket board bearer 21 rotatable and made to bear two socket boards 1, and the two socket boards on the socket board bearer 21 are interchangeable in position by the rotation of the socket board bearer 21 by 180 degrees. A socket board conveying device 23 provided on the installation base 11 carries out the transportation of the socket boards 1 between the socket board rack 19 and the socket board table 20.

Furthermore, provided on the installation 11 is a robot body 24 which transfers the IC's 13 between the tray 4 on the tray table 14 and the socket board 1 on the socket board table 20. This robot body 24 supports a mounting/demounting head 25 for sucking and holding the IC's 13 so that it is movable vertically. Moreover, within the operating range of the mounting/demounting head 25 due as limited by robot body 24 there is provided a centering tool stocker 28 for supporting centering tools 27 to be mounted on the mounting/demounting head 25. Placed on this centering tool stocker 28 are a plurality of centering tools 27 corresponding to different size IC's 13 and further planted thereon is a center positioning member 26.

A control panel 30 is fixedly secured to a transparent cover 29 situated on the installation base 11. The installation base 11 accommodates a control section 70 having a sequence controller to control the operation of the entire system, and the control panel 30 is connected with this control section 70.

Within the operating range of the robot body 24 on the installation base 11 there is provided a temporary resting stage 31 having a plurality of IC supporting sections 31 a to accept the IC's 13 during transportation between the tray 4 and the socket board 1. The IC supporting sections 31a of the temporary resting stage 31 are designed to accept a plurality of different size IC's 13.

Next, a description a basic operation of the entire system will follow. First of all, a tray magazine 4A accommodating a plurality of trays 4 piled up and carrying the IC's 13 before the burn-in test is put on the tray lifting device 12, and the socket board rack 19 accommodating a plurality of socket boards 1 after the burn-in test are joined at a given position.

Thereafter, the system operation is started by operating the control panel. With the tray lifting device 12, the trays 4 within the tray magazine 4A are gradually lifted so that the uppermost tray 4 is conveyed by the tray conveying device 17 to the tray bearer 15 of the tray table 14. After this, the tray table 14 rotates half way so that the tray table 14 can accept the next tray 4. In a similar way, two socket boards 1 are transferred onto the socket board table 20.

In this state, the mounting/demounting head 25 is shifted by the robot body 24 to be above the socket board 1 on the socket board table 20, and an Tested IC's 13 is extracted by the mounting/demounting head 25. The extracted IC 13 is sucked up by the mounting/demounting head 25 in a positioned condition and then carried to the IC supporting section 31a of the temporarily placing table 31 and released from the mounting/demounting head 25.

Subsequently, the mounting/demounting head 25 is moved to be above the tray 4 on the tray table 14 to suck up the Untested IC's 13. This IC 13 is connected to a vacant IC socket 1A on the socket board 1 to which another IC 13 had been connected. Thereafter, the next IC 13 on the same socket board 1 is picked up by the mounting/demounting head 25 and transferred to the tray 4.

By repeating this operation, the Untested IC's 13 are coupled to all the sockets 1A on the socket board 1, and then the socket board table 20 rotates half way around and the tested IC's 13 on the next socket board 1 are replaced with the untested IC's 13. Further, the socket board 1 on which untested IC's 13 are connected to all the IC sockets 1A is returned to within the socket board rack 19 by the socket board conveying device 23 during the operation for the next socket board 1, and in place a different socket board 1 within the socket board rack 19 is shifted to be above the socket board table 20.

On the other hand, when all the IC's 13 within the tray 4 are interchanged with tested IC's 13, the tray table 14 is rotated half way so that the untested IC's 13 in the next tray 4 are interchanged with the tested IC's 13. In addition, the tray 4 filled with tested IC's 13 is transferred by the tray conveying device 17 into a vacant tray magazine 4A of the tray lifting device 16 during the operation the next tray 4. Moreover, the next tray 4 is conveyed onto the tray table 14. After the repetition of this operation, at the load end time the IC's 13 on the temporary resting stage 31 are transferred to the tray 4.

Furthermore, when the size of the IC 13 to be handled changes, the information on the kind of IC 13 is input to the control panel 30 whereupon, the mounting/demounting head 25 is moved above the centering tool stocker 28 and the centering tool 27 is automatically replaced, to match the size of the IC's 13.

Since, as described above, the replacement of the socket board 1 by the socket board table 20 and the replacement of the tray 4 by the tray table 14 are instantaneously possible, these replacement operations do not require the system to stop, thus improving working efficiency. In addition, changes in the kind of IC 13 is possible in only a short time because only the centering tool 27 is replaced without having to replace the whole mounting/demounting head 25, thus enhancing the working efficiency accompanying changes in IC type.

The procedure for moving the IC 13 is not limited to the above. For example, it is also possible for the untested IC's 13 on the tray 4 is initially put on the temporary resting stage 31.

In addition, if either a vacant tray 4 or a vacant socket board 1 is first transferred onto the tray table 14 or the socket board table 20, it is possible to interchange an untested IC's 13 with a tested IC's 13 without the use of the temporary resting stage 31. Moreover, the interchange between the Untested IC's 13 and the Tested IC's 13 is also possible without the use of the temporary resting stage 31 by making one section of the first tray 4 or one IC socket 1A of the first socket board 1 vacant.

Figure 3:
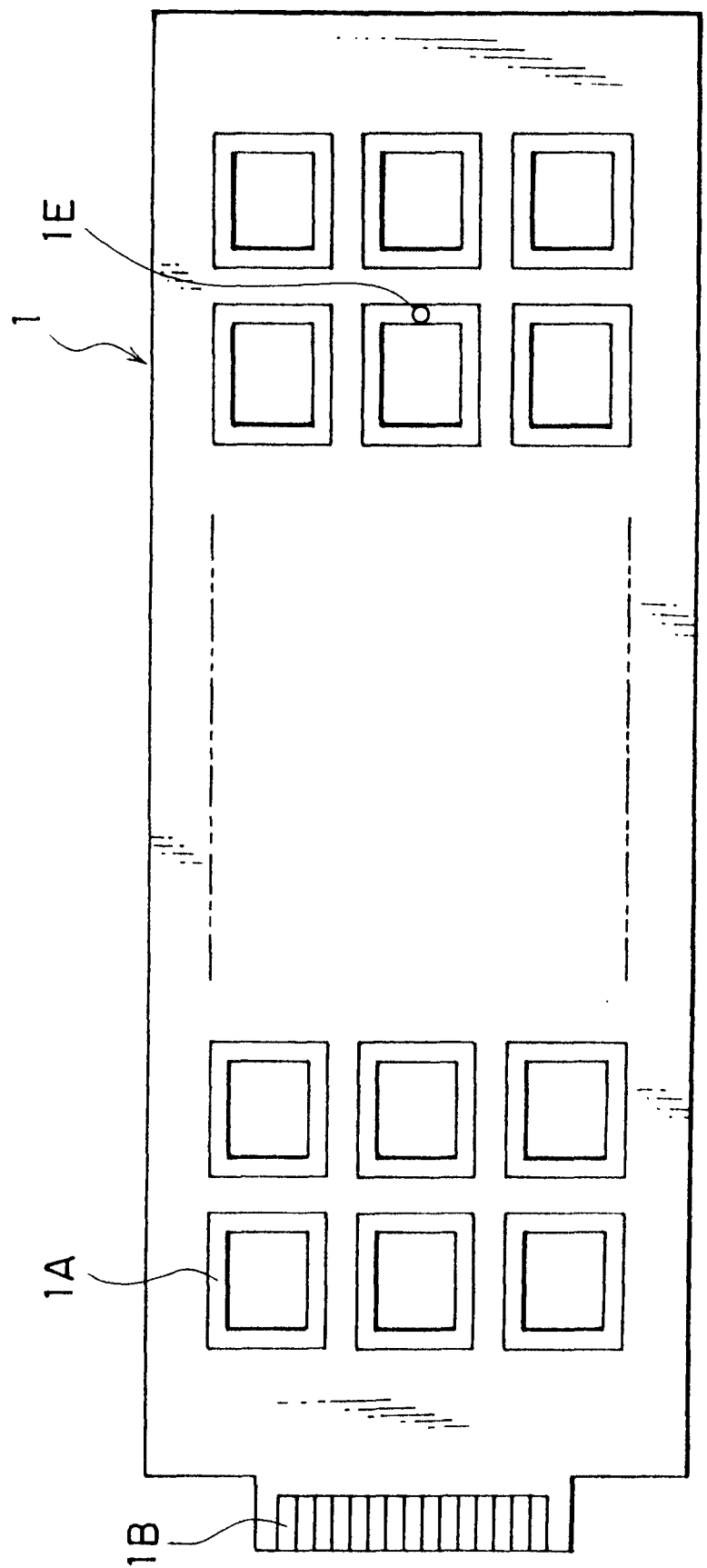
FIG. 3 is a plan view showing one example of socket boards.

Next, a detailed description will follow of the respective sections of the IC mounting/demounting system shown in FIG. 1. FIG. 3 is a plan view showing one example of a socket board 1. In the illustration, a plurality of IC sockets 1A are arranged on the socket board 1 and further a wiring pattern (not shown) is placed thereon for energizing these IC sockets 1A. In addition, at one end portion of the socket board 1 there is provided a connector 1B which is inserted into a connecting section of a burn-in furnace (not shown) to be electrically coupled thereto. Moreover, when there is a defective IC socket 1A, a defective indicator 1E (or mark) is given to the IC socket 1A. As this defective indicator 1E, for example stickers colored in white, yellow, red or the like may be used.

Figure 4:
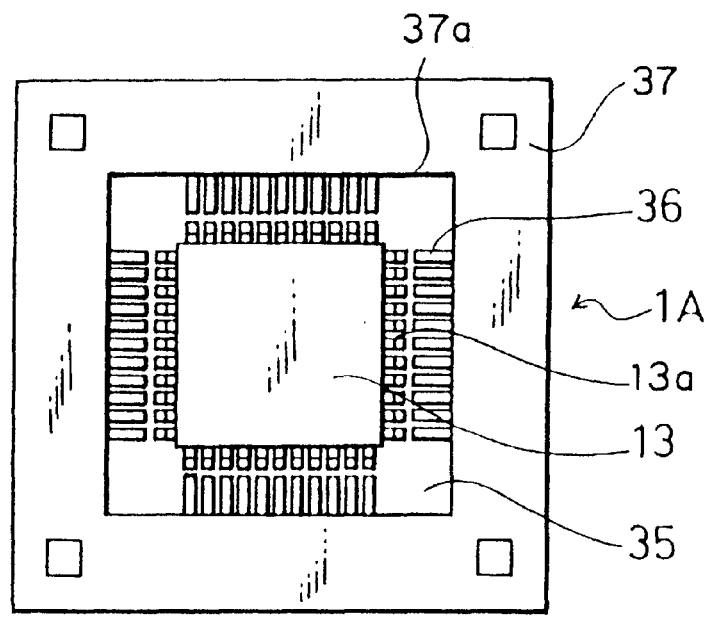
FIG. 4 is a plan view showing one example of IC sockets.
Figure 5:
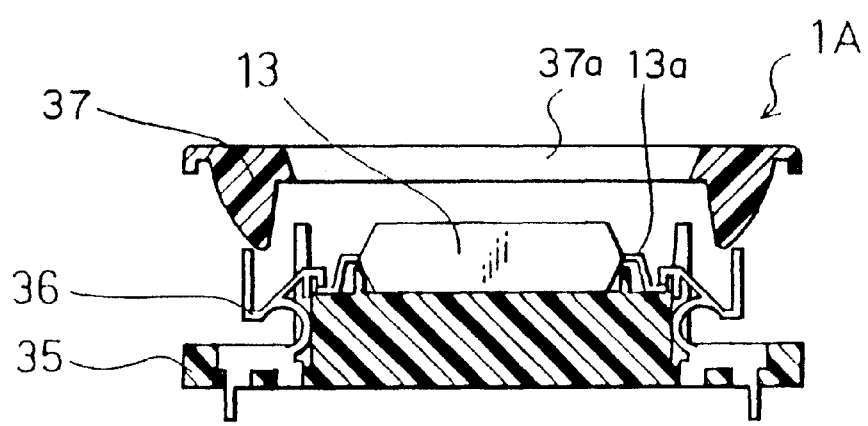
FIG. 5 is a cross-sectional view showing the FIG. 4 IC socket.
Figure 6:
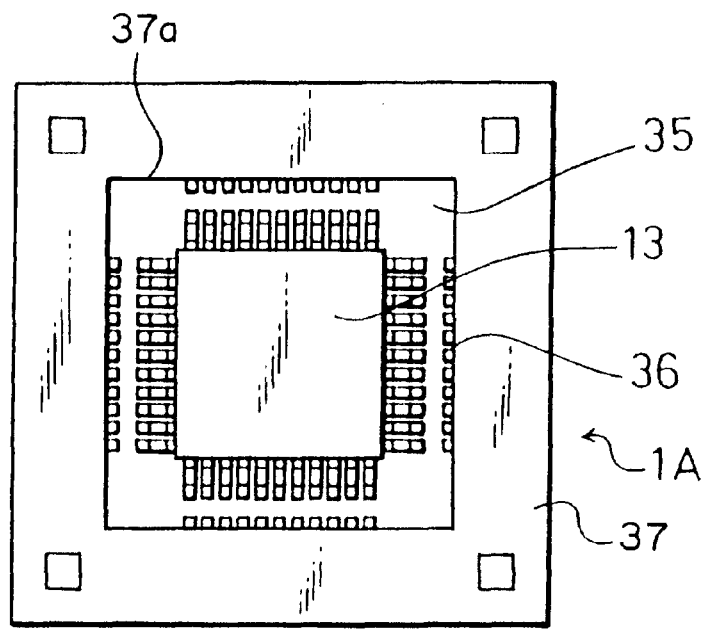
FIG. 6 is a plan view showing a state where a cover shown in FIG. 4 undergoes depression.
Figure 7:
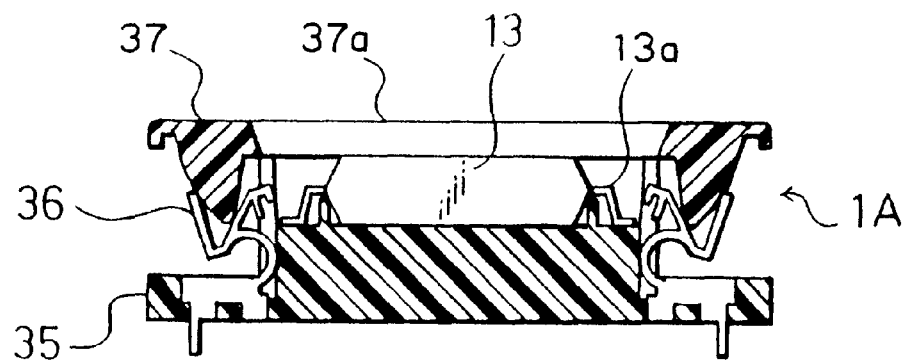
FIG. 7 is a cross-sectional view of the state shown in FIG. 6.

FIG. 4 is a plan view showing one example of IC sockets, FIG. 5 is a cross-sectional view of the FIG. 4 IC socket, FIG. 6 is a plan view showing a state where a cover shown in FIG. 4 is in a pressed condition, and FIG. 7 is a cross-sectional view of FIG. 6. On a base 35 of the IC socket 1A, a plurality of contact pins 36 elastically deformable are provided in corresponding relation to external leads 13a of the IC 13. These contact pins 36 hold down the external leads 13a from above by their elastic forces. In addition, provided on the base 35 is a cover 37 serving as a movable section engaged with all the contact pins 36, and an opening 37a is provided in a central portion of the cover 37 to allow the insertion of the IC 13.

In such an IC socket 1A, the cover 37 is evenly pressed by the mounting/demounting head 25 (see FIG. 1) when mounting/demounting the IC 13. So that, all the contact pins 36 are elastically deformed to release the external leads 13a as shown in FIG. 7. On releasing the cover 37 from this pressing, the cover 37 moves upwardly, so that the contact pins 36 return to their original shapes and the external leads 13a are pressed by the contact pins 36. Accordingly, the external leads 13a and the contact pins 36 come into electric connection with each other.

Figure 8:
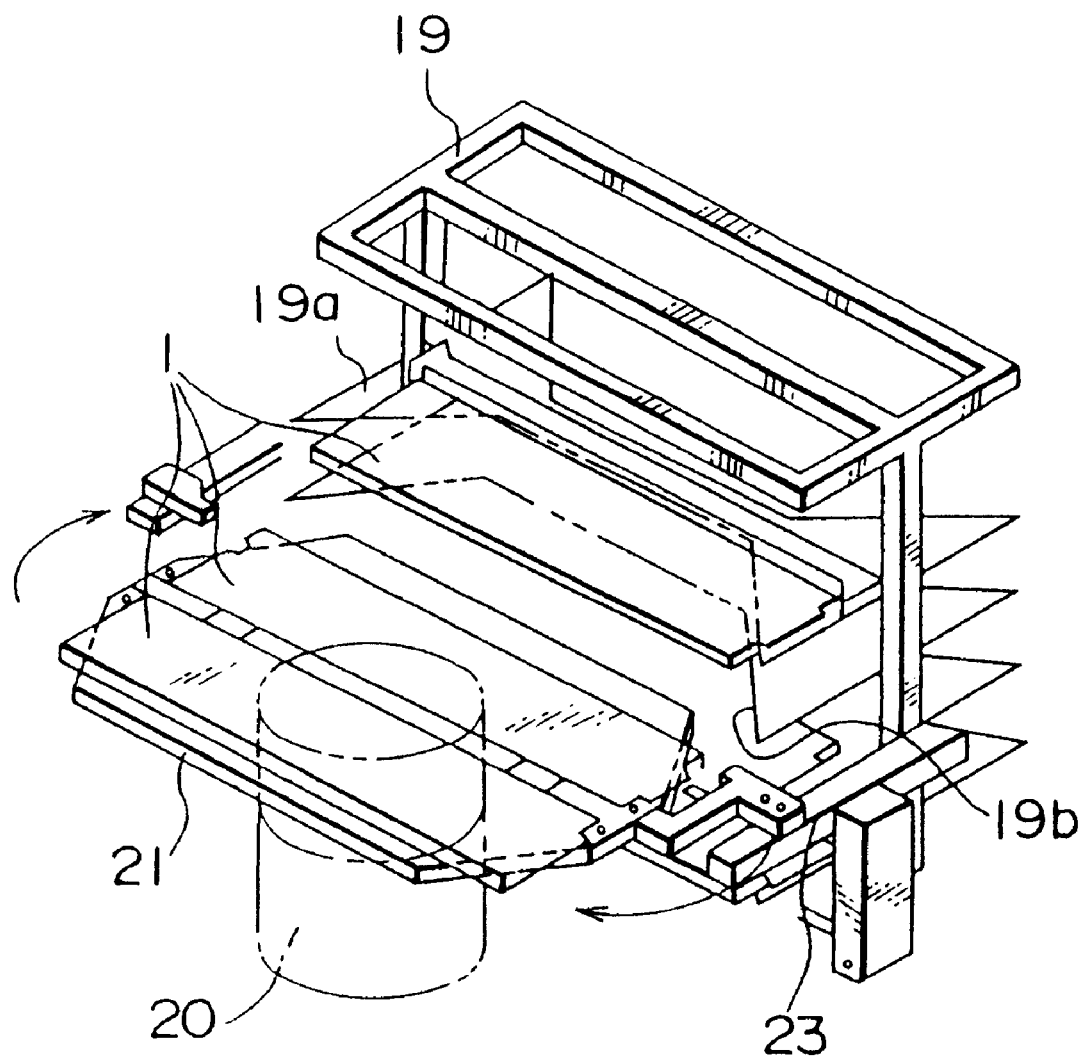
FIG. 8 is a perspective view showing the socket board rack and socket board table in FIG. 1.
Figure 9:
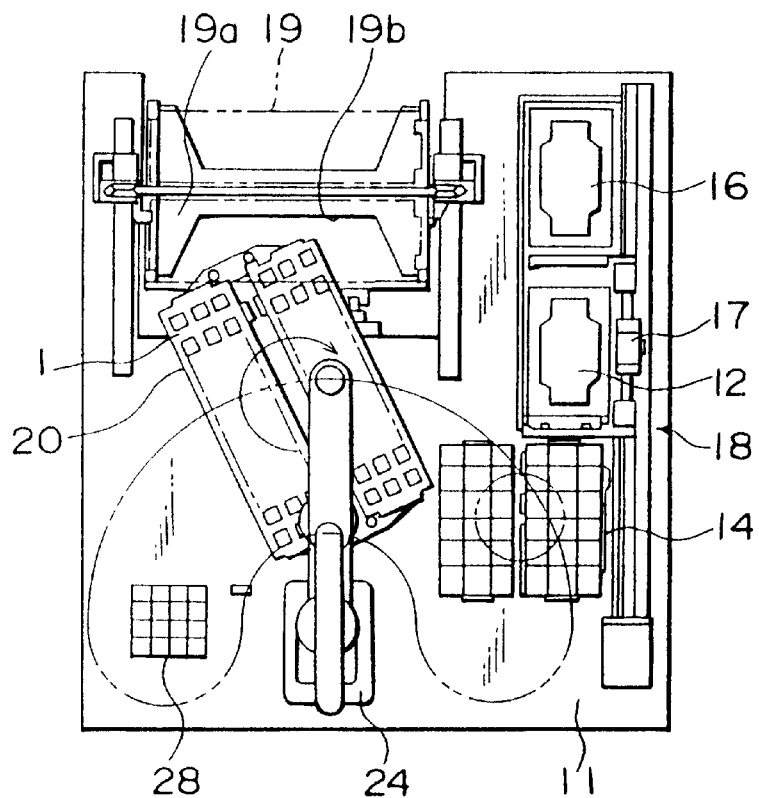
FIG. 9 is an illustration useful for explaining a socket board transposing operation of a socket board table.
Figure 10:
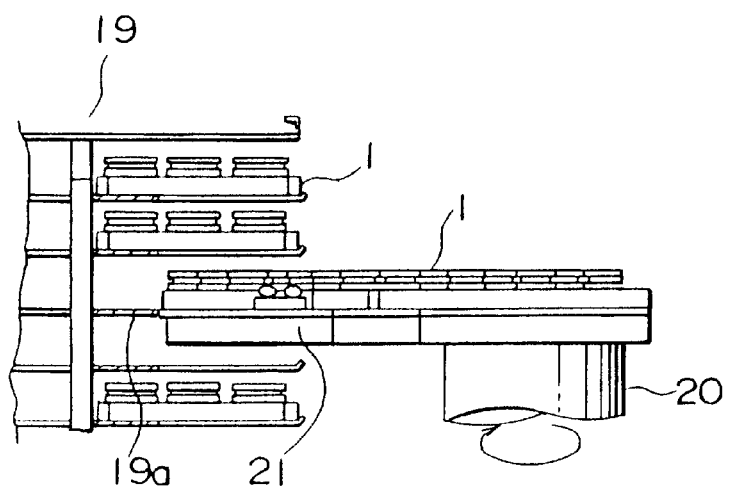
FIG. 10 is a cross-sectional view showing a principal portion of FIG. 9.

Next, FIG. 8 is a perspective view showing the socket board rack 19 and the socket board table 20 in FIG. 1, FIG. 9 is an illustration for describing a socket board transposing operation of the socket board table, and FIG. 10 is a cross-sectional view showing a principal section of the FIG. 9 socket board table.

The socket board rack 19 has a plurality of socket board storage shelves 19a for bearing the socket boards 1, and each of the socket board storage shelves 19a has a notch portion 19b. Further, at the rotation of the socket board bearer 21, the socket board bearer 21 and the socket boards 1 thereon rotate within the notch portion 19b between the socket boards 1 accommodated within the socket board rack 19 as shown in FIG. 10. Thus, any interference between the socket board table 20 and the socket board rack 19 is avoidable, with the result that it is possible to shorten the distance between the socket board rack 19 and the socket board table 20 to accomplish the size reduction of the entire system and further to facilitate the conveyance of the socket boards 1 between the socket board rack 19 and the socket board table 20. Incidentally, the socket board 19 is naturally disposed so as not to interfere with the other devices on the installation base 11.

Figure 11:
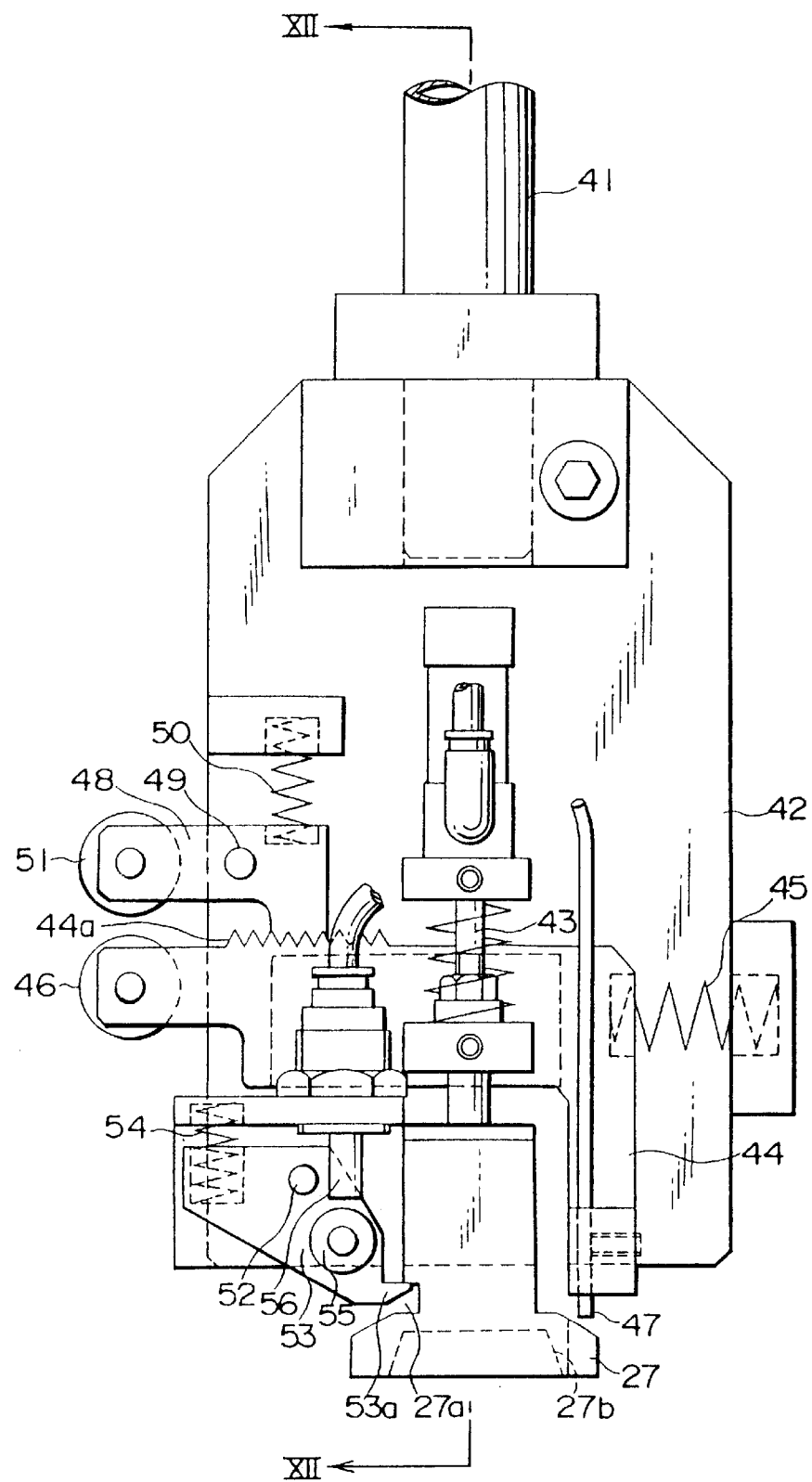
FIG. 11 is a front elevational view showing the mounting/demounting head of FIG. 1.
Figure 12:
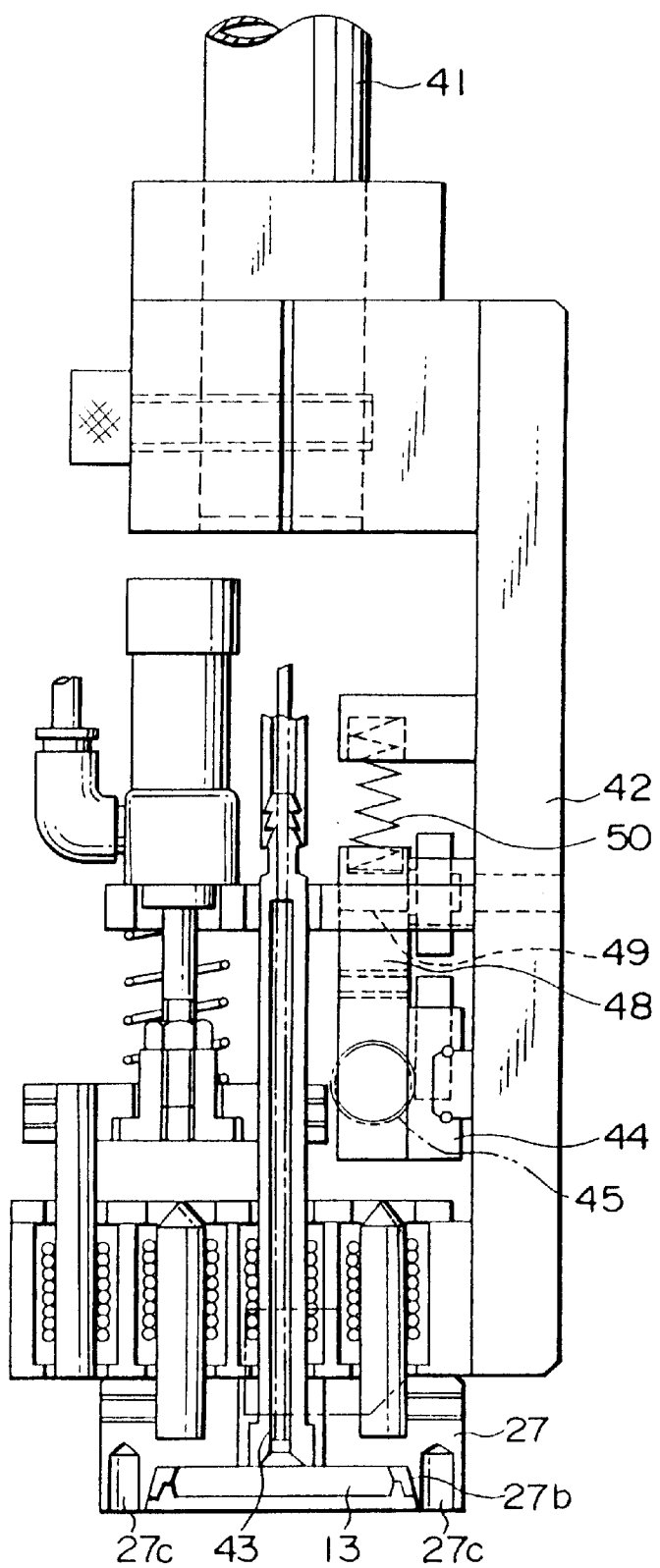
FIG. 12 is a cross-sectional view taken along a line XII—XII of FIG. 11.

Still further, description will be made hereinbelow of a construction of the mounting/demounting head 25. FIG. 11 is a front elevational view showing the mounting/demounting head 25 of FIG. 1, and FIG. 12 is a cross-sectional view taken along a line XII—XII of FIG. 11. In the illustrations, a frame 42 is fixedly secured to a lower end portion of a head shaft 41 supported on the robot body 24 to be movable vertically. In addition, a suction spindle 43 for sucking up the IC's 13 is fixed to the frame 42. A slide member 44, being a moving member slidable horizontally in FIG. 11, is biased by a spring 45 to the left in FIG. 11. A first roller 46 is provided at one end portion of the slide member 44. Further, fixed to the slide member 44 is the tip portion of a defective indicator detecting sensor 47 for detecting the presence or absence of the defective indicator 1E of FIG. 3.

In the slide member 44 an engagement section 44a is provided with a plurality of teeth, and a lock member 48 for locking the sliding action of the slide member 44 by engaging with the engagement section 44a is fitted to the frame 42 to be rotatable about a pin 49. The lock member 48 is biased by a spring 50 in a direction of engaging with the engagement section 44a. A second roller 51 is located at one end portion of the lock member 48.

To a lower end portion of the frame 42 there is fitted a lever 53 rotatable about a shaft 52, and on the tip portion of this lever 53 there is provided a chuck claw 53a made to engage with a recess portion 27a of the centering tool 27. The lever 53 is biased by a spring 54 in a direction that the chuck claw 53a engages with the recess portion 27a. A chuck release roller 55 is rotatably fitted to the lever 53. Further, mounted on the frame 42 is an air cylinder 56 for rotating the lever 53 against the spring 54 in response to the pressing of the chuck release roller 55.

In this example, a head body 57 is equipped with the frame 42 and the respective parts 43 to 56 placed on the frame 42. Further, provided in the centering tool 27 is a centering recess portion 27b for positioning (centering) the IC 13. A side wall of this centering recess portion 27b has a tapered inclination surface with which the external leads of the IC 13 come into contact, for example the inclination angle is set to 15 degrees. In addition, the side wall of the centering recess portion 27b is mirror finished to smooth the centering work. Moreover, a socket pusher 27c for evenly pressing the cover 37 of the IC socket 1A is integrally formed around the centering recess portion 27b at the lower end portion of the centering tool 27. The tip portion of the suction spindle 43 is open within the centering recess portion 27b.

Figure 13:
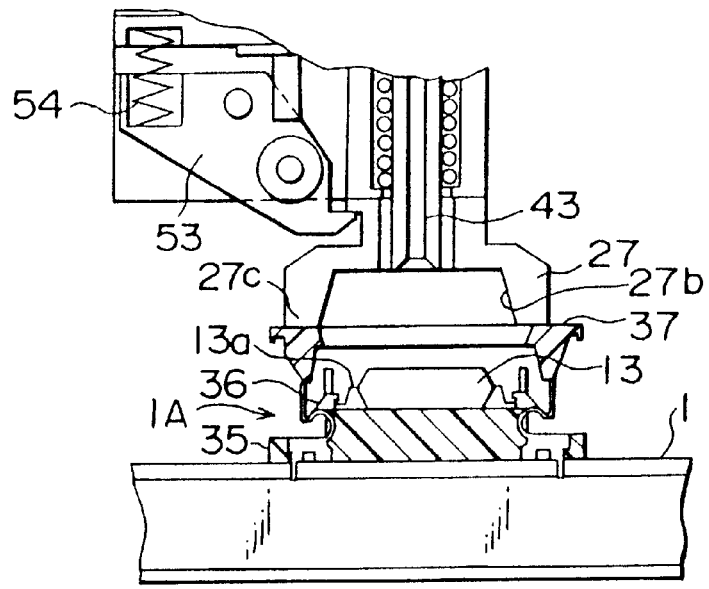
FIG. 13 is a cross-sectional view showing an IC extracting operation by the FIG. 11 mounting/demounting head.
Figure 14:
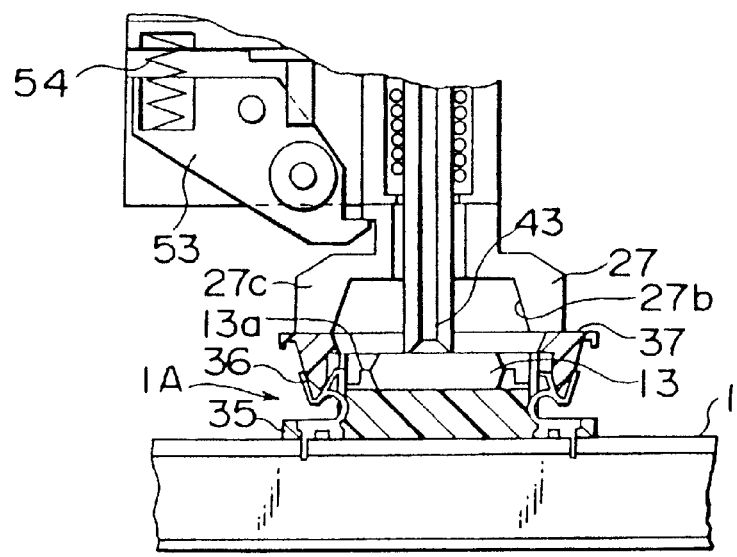
FIG. 14 is a cross-sectional view showing a state where a cover of an IC socket shown in FIG. 13 is held down.

For example, when the mounting/demounting head 25 picks up the IC 13 connected to the IC socket 1A, as shown in FIG. 13, the mounting/demounting head 25 is first shifted to the position of the IC socket 1A, and the socket pusher 27c of the centering tool 27 is brought into contact with the cover 37 of the IC socket 1A. Subsequently, as shown in FIG. 14 the cover 37 is pressed downward by the socket pusher 27c of the centering tool 27, so that the contact pins 36 are elastically deformed to release the external leads 13a and the tip portion of the suction spindle 43 is brought into contact with the IC 13 which in turn, is sucked up by the suction spindle 43.

Figure 15:
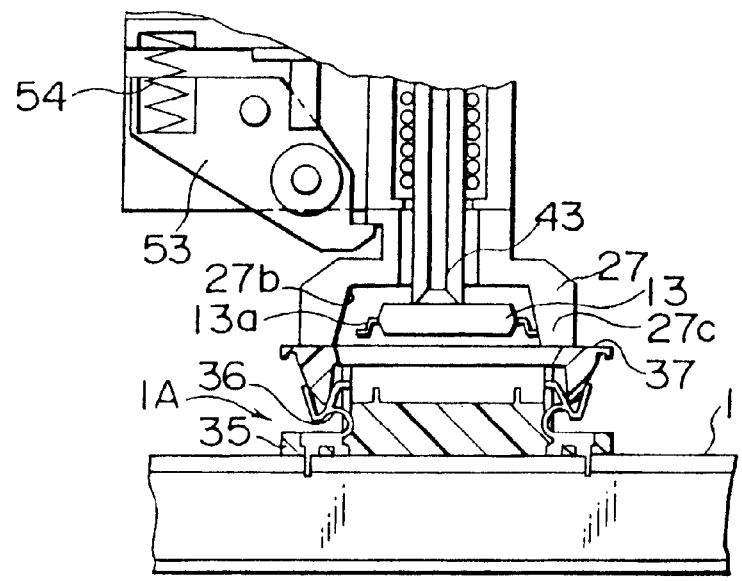
FIG. 15 is a cross-sectional view showing a state where an IC shown in FIG. 14 is extracted from an IC socket.
Figure 16:
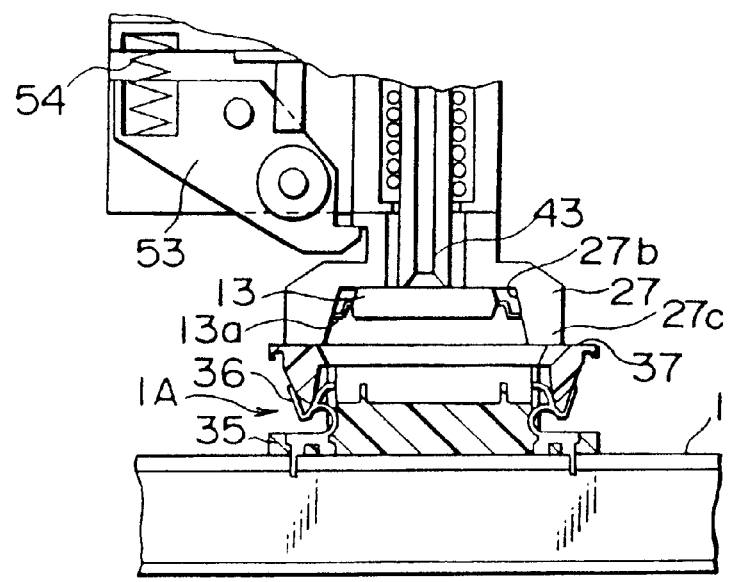
FIG. 16 is a cross-sectional view showing a state of centering the IC in FIG. 15.

Thereafter, as shown in FIG. 15 the suction spindle 43 is moved upwardly relative to the centering tool 27. Thus, the external leads 13a of the IC 13 are guided along the tapered surface of the centering recess portion 27b, thereby centering the IC 13 as shown in FIG. 16. In the case that the position of the IC 13 shifts during suction as shown in FIG. 14, at the centering the IC 13 slides with respect to the tip surface of the suction spindle 43. Accordingly, the tip surface of the suction spindle 43 is made of a material that allows the sliding of the IC 13, for example a mirror finished metal. After this, as shown in FIG. 17 the suction head 25 is lifted above the tray 4. Further, the connection of the IC 13 to the IC socket 1A is made with the reverse procedure.

Next, a description will be made of the operation of the IC mounting/demounting system when the kind (size) of the IC 13 is changed. First, the operator inputs an instruction for the type of changing operation to the control panel 30 in FIG. 1 and further inputs the necessary information including the kind of new IC, the IC socket to be used, etc. This controls, the robot body 24 to bring the mounting/demounting head 25 is to the centering tool stocker 28. The memory of the control section 70 previously stored with the storage positions of the respective centering tools 27 in the centering tool stocker 28, and the mounting/demounting head 25 is correctly moved to the storage position of the centering tool 27 currently loaded according to that data.

Figure 18:
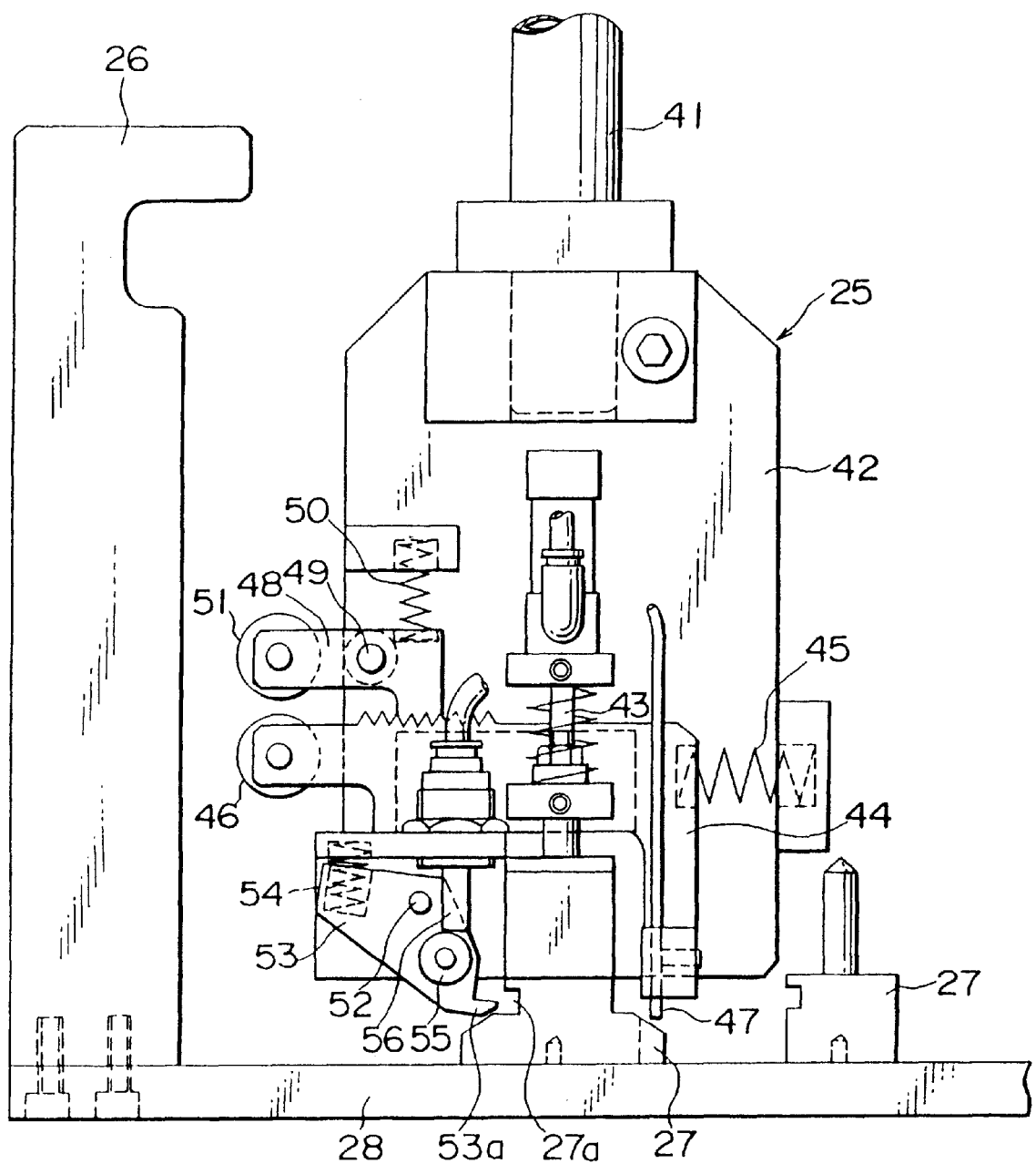
FIG. 18 is a structural view showing a state where the centering tool of the FIG. 11 mounting/demounting head is put into a released condition.
Figure 19:
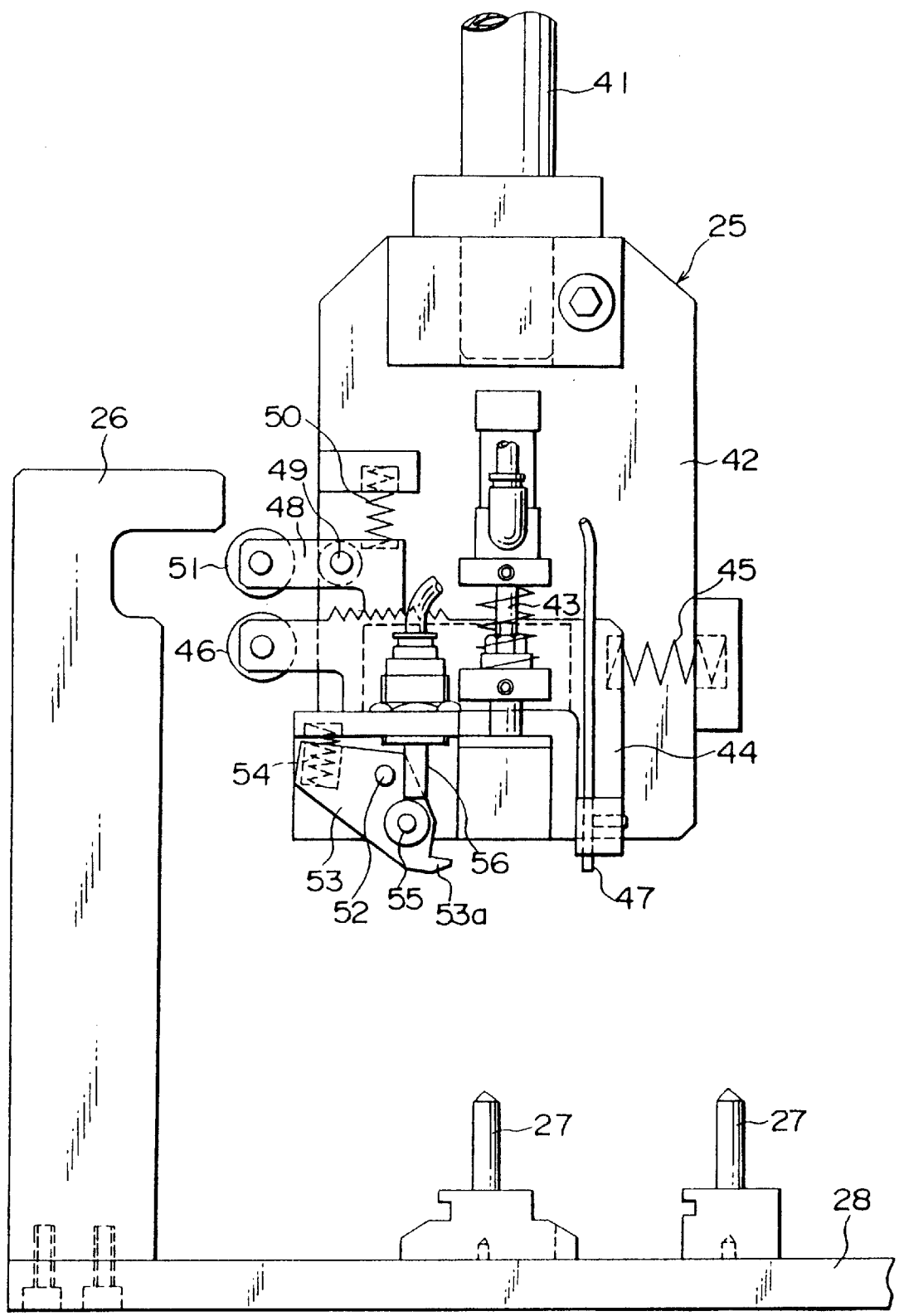
FIG. 19 is a structural view showing an upwardly moved state of the FIG. 18 mounting/demounting head.

Following this, when the air cylinder 56 of the mounting/demounting head 25 comes into operation, as shown in FIG. 18 the lever 53 is rotated against the spring 54 to release the engagement of the chuck claw 53a with respect to the recess portion 27a of the centering tool 27. In this state, the mounting/demounting head 25 is moved upwardly to release the centering tool 27 as shown in FIG. 19.

Figure 20:
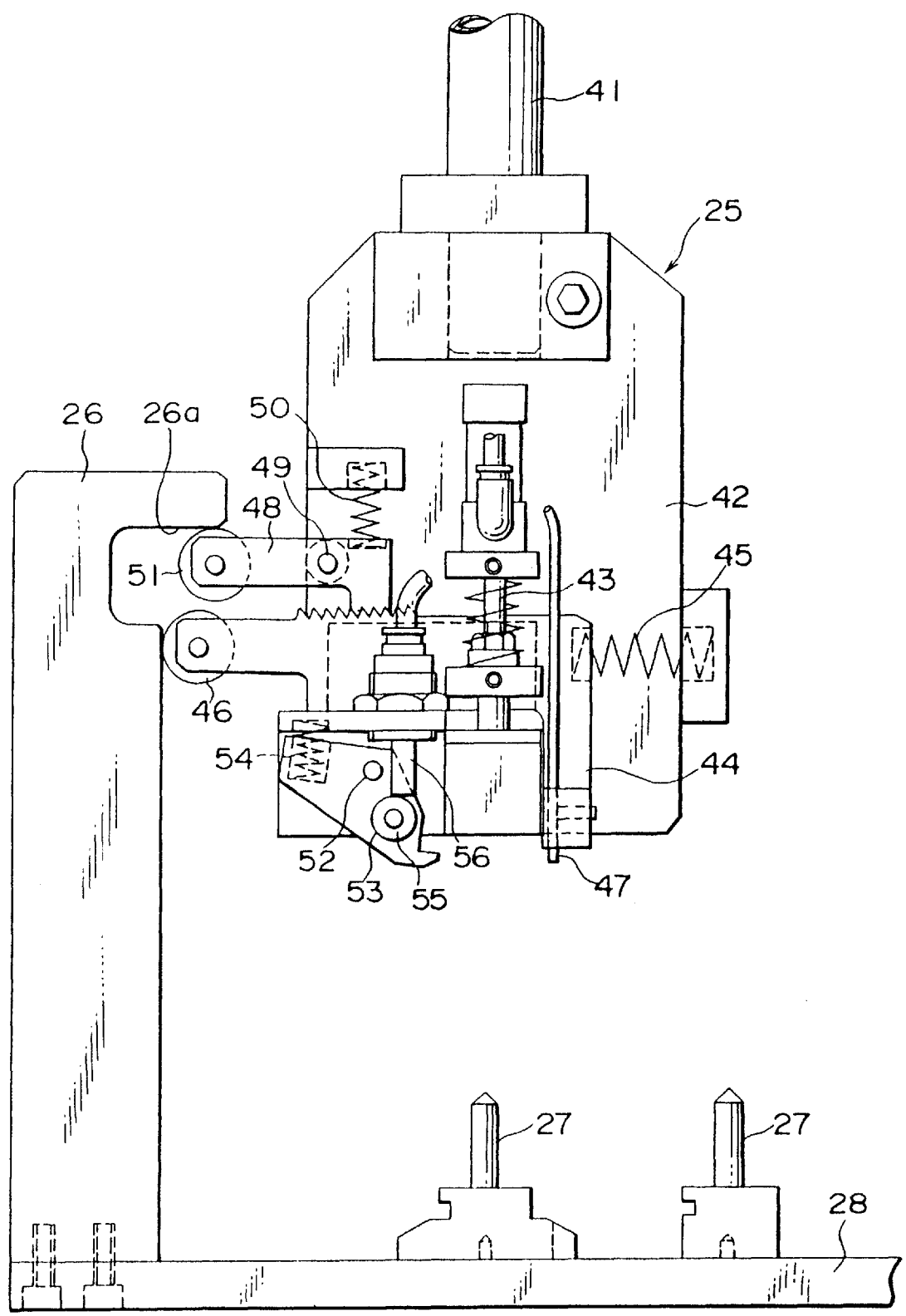
FIG. 20 is a structural view showing a state that the FIG. 19 mounting/demounting head is brought into contact with a sensor positioning member.
Figure 21:
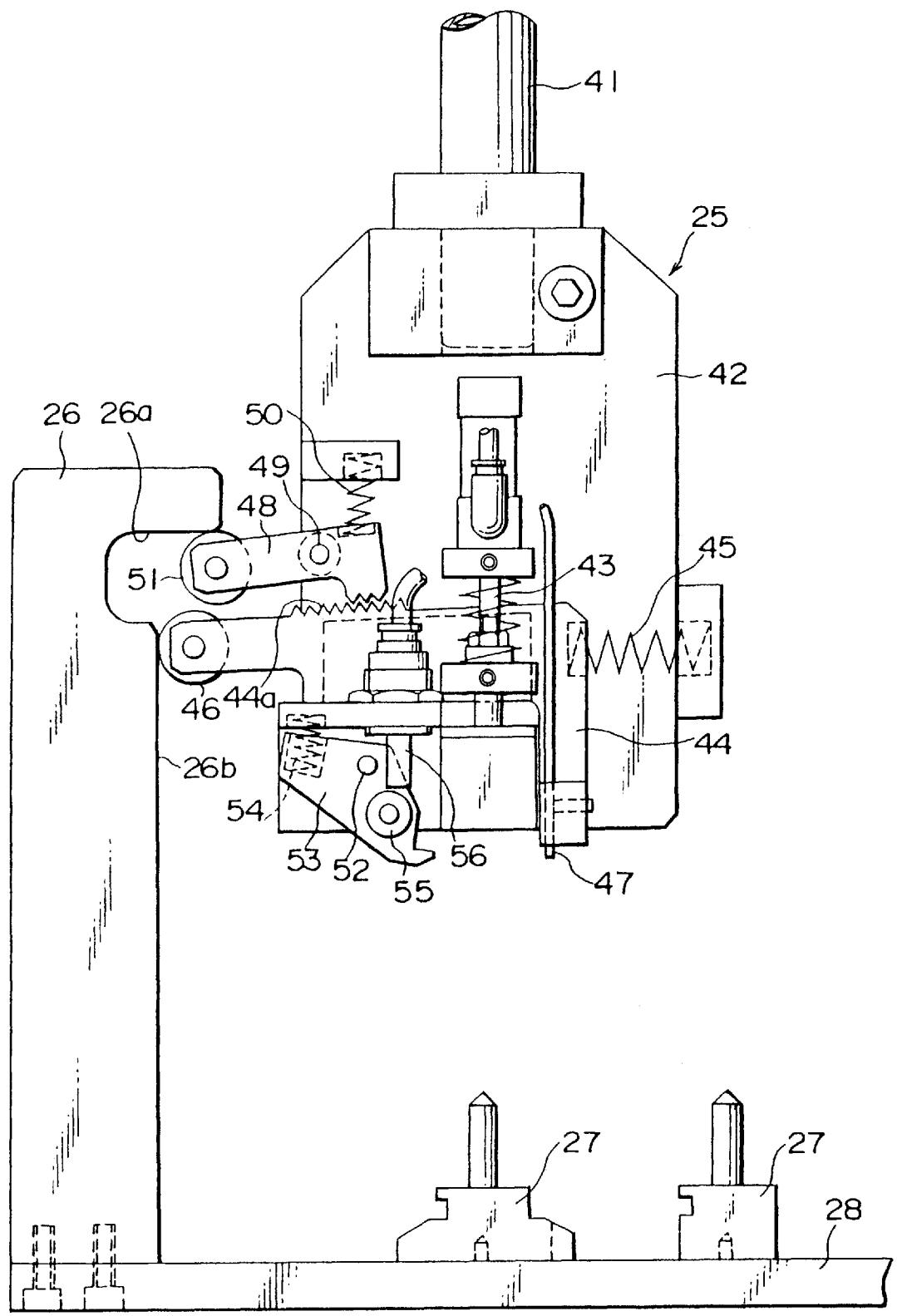
FIG. 21 is a structural view showing a rotated state of the lock member illustrated in FIG. 20.

Thereafter, as shown in FIG. 20 the mounting/demounting head 25 is moved so that the second roller 51 comes into contact with a horizontal contact surface defined on the sensor positioning member 26 in opposed relation to the upper surface of the centering tool stocker 28. After this, as illustrated in FIG. 21 the mounting/demounting head 25 is slightly lifted so that the lock member 48 rotates against the spring 50 to separate from the gear section 44a of the slide member 44.

Thus, the slide member 44 is released from the locked condition and slides by being pushed by the spring 45, and the first roller 46 is brought into contact with a vertical contact surface 26b formed on the sensor positioning member 26. In this state, the mounting/demounting head 25 is moved horizontally to the right and left in the illustration, thus adjusting the position of the slide member 44 with respect to the frame 42, i.e., the position of the defective indication detecting sensor 47. After the adjustment of the position of the defective indication detecting sensor 47, when the mounting/demounting head 25 is moved slightly, the lock member 48 is rotated by the spring 50, so that the position of the slide member 44 comes into a locked state.

Figure 22:
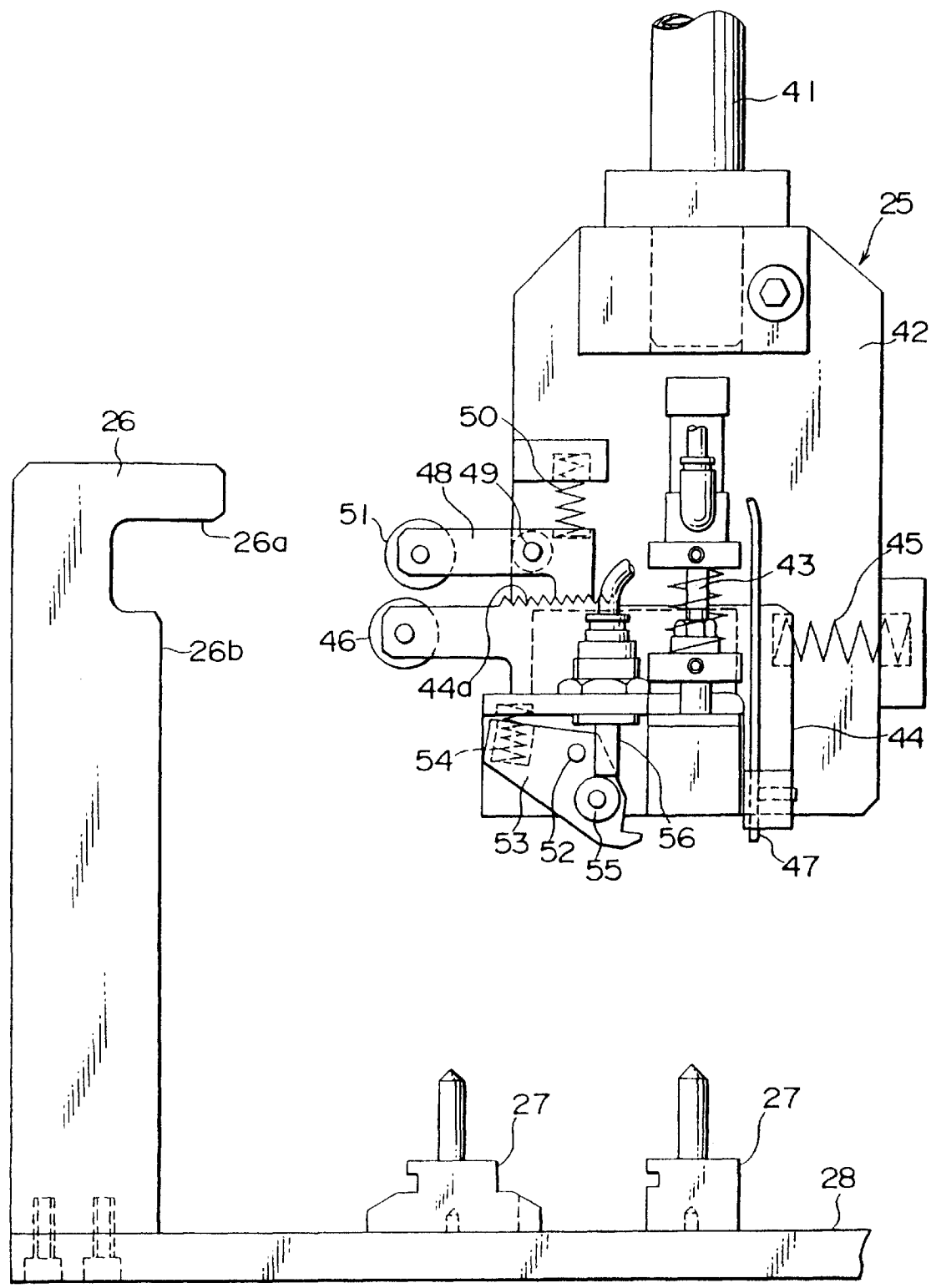
FIG. 22 is a structural illustration of a position changed state of the defective indicator detecting sensor in FIG. 21.
Figure 23:
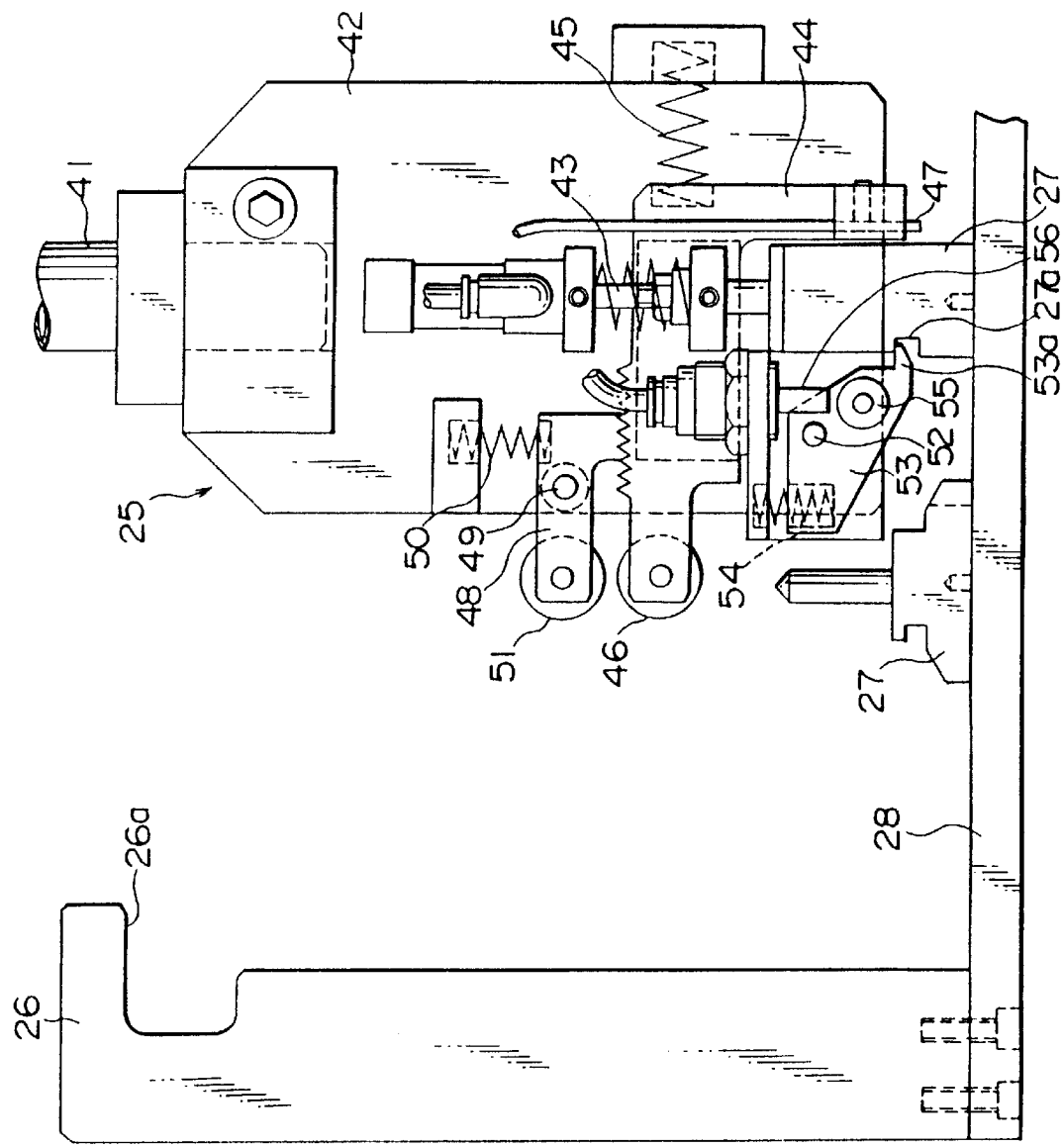
FIG. 23 is a structural illustration of a state where a centering tool after change is set to the FIG. 22 mounting/demounting head.
Figure 24:
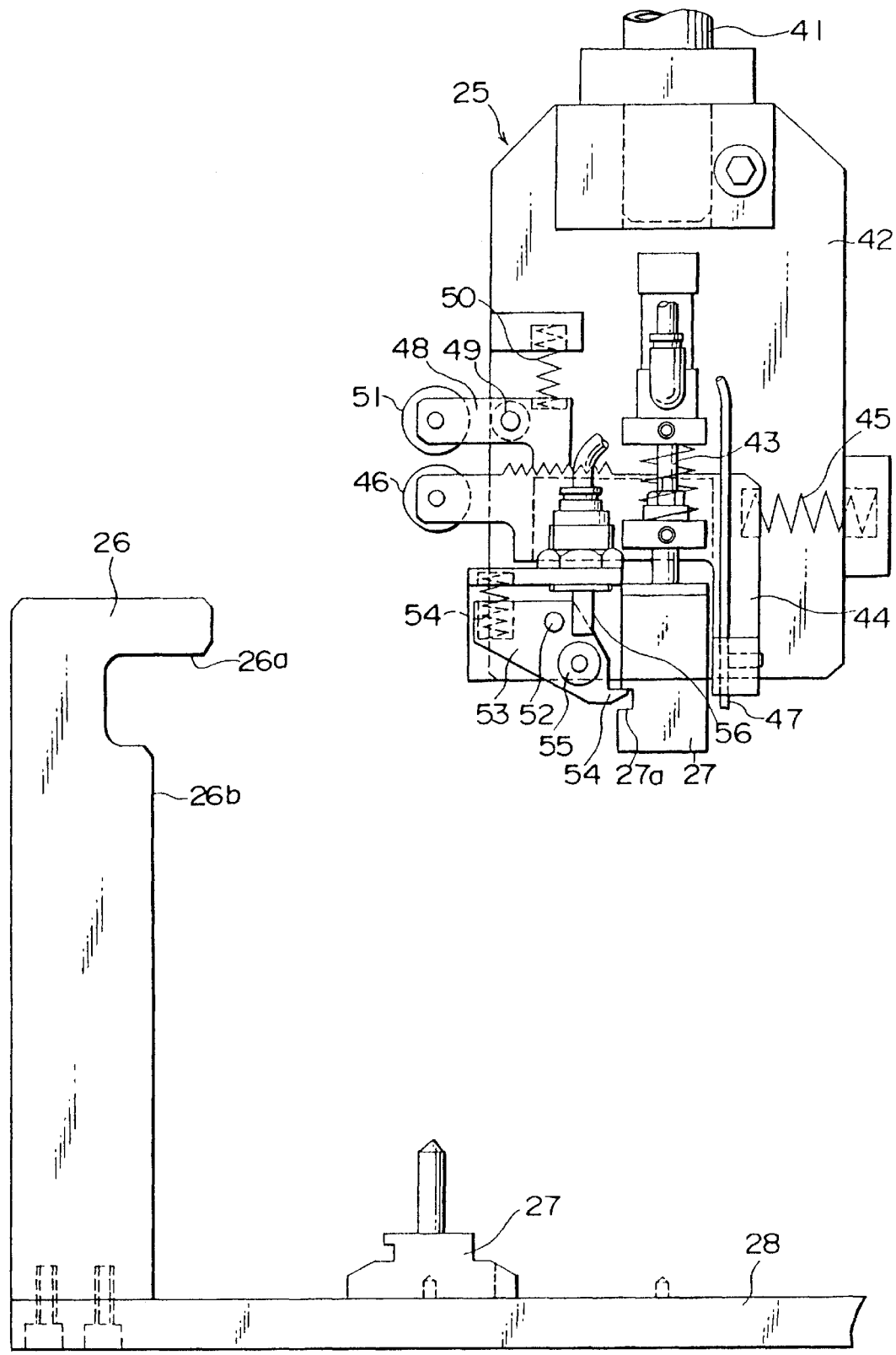
FIG. 24 is a structural view showing an upwardly moved state of the FIG. 23 mounting/demounting head.

After this, as shown in FIG. 22 the mounting/demounting head 25 is correctly shifted above a new centering tool 27. Then, as shown in FIG. 23, after the downward movement of the mounting/demounting head 25, the release is made from the pressing of the chuck release roller 55 due to the air cylinder 56 and the lever 53 is rotated by the spring 54, so that the chuck claw 53a fits into the recess portion 27a of the centering tool 27. Further, as shown in FIG. 24 the replacement of the centering tool 27 is completed by the upward movement of the mounting/demounting head 25.

According to the IC mounting/demounting system equipped with this mounting/demounting head 25, the replacement of the entire mounting/demounting head 25 is unnecessary irrespective of the change in size of the IC 13 to be handled, and therefore no time is taken for the replacement of the mounting/demounting head 25, thus strikingly improving working efficiency. In addition, the replacement of the centering tool 27 is automatically possible by storing the information about the IC's 13 in the control section, further improving the working efficiency.

Furthermore, although the size of the IC socket 1A varies with the change in size of the IC 13, since a socket pusher 27c having a size corresponding to the size of the IC 13 is formed in the centering tool 27 in advance, with the replacement of the centering tool 27 alone, it is also possible to simultaneously cope with the change in size of the IC socket 1A, and the structure of the mounting/demounting head 25 can be simplified.

Still further, although the change in size of the IC socket 1A causes a change in the size of the cover 37 and a deviation in the position of the defective indication 1E with respect to the mounting/demounting head 25, since the position of the defective indication detecting sensor 47 in the horizontal direction is automatically adjusted, the detection of a defective socket is easy regardless of the change in size of the IC 13.

Moreover, since release of the centering tool 27 from its locked condition is made by rotating the lever 53 through the use of the air cylinder 56, the mounting/demounting of the centering tool 27 can be quickly carried out even in a small space.

Second Embodiment

Figure 25:
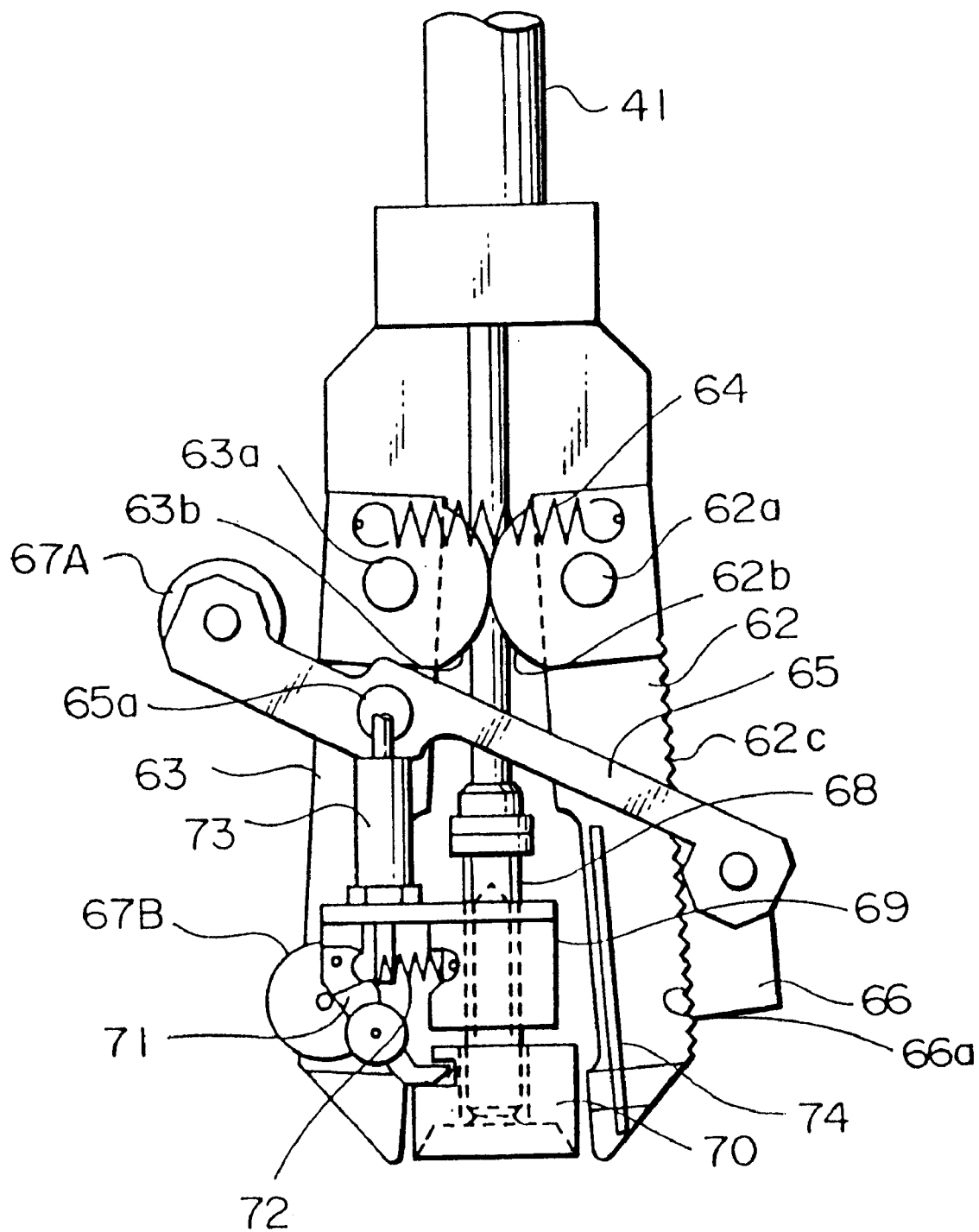
FIG. 25 is a front elevational view showing a mounting/demounting head of an IC mounting/demounting system according to a second embodiment of the present invention.

FIG. 25 is a front elevational view showing a mounting/demounting head of an IC mounting/demounting system according to a second embodiment of the present invention. In the illustration, on a lower end portion of a head shaft 41 supported by a robot body 24 to be movable vertically there are provided a pair of socket pushers, i.e., first and second socket pushers 62, 63, for pressing a cover 37 of an IC socket 1A, which are rotatable about supporting points 62a, 63a. The first and second socket pushers 62, 63 are respectively provided with synchronous gears 62b, 63b which engaged with each other during the rotation of the first and second socket pushers 62, 63. In addition, the first socket pusher 62 includes an engagement surface 62c having successive fine grooves with a triangular cross section.

The first and second socket pushers 62, 63 are biased by a spring 64 in a direction to separately open their lower end portions. A lever 65 is attached to the second socket pusher 63 to be rotatable about a supporting point 65a. Further, a stopper 66 is rotatably fitted to one end portion of the lever 65 to restrict the rotational movements of the first and second socket pushers 62, 63 in their opening directions. Moreover, the stopper 66 includes an engagement surface 66a which is engaged with the engagement surface 62c of the first socket pusher 62. The separation between the lower end portions of the first and second socket pushers 62, 63, i.e., the opening degree thereof, is made to be adjustable in a manner that the position of the stopper 66 in the longitudinal direction of the first socket pusher 62 is adjusted with the rotation of the lever 65. A rotatable first roller 67A is fitted to the other end portion of the lever 65, while a rotatable second roller 67B is fitted to the second socket pusher 63.

Between the first and second socket pushers 62, 63 there is located a suction spindle 68 extending in the axial direction of the head shaft 41 and serving as a suction section. A fixed base 69 is fixedly secured to a housing (not shown) fixed with respect to the head shaft 41. This fixed base 49 is provided with a centering tool 70 for centering the IC 13. The centering tool 70 is released from the mounting/demounting head so that a chuck claw 71 is rotated by an air cylinder 73 against a spring 72.

To the first socket pusher 62 there is attached a defective indication detecting sensor 74 for detecting a defective indication 1E of the IC socket 1A.

Figure 26:
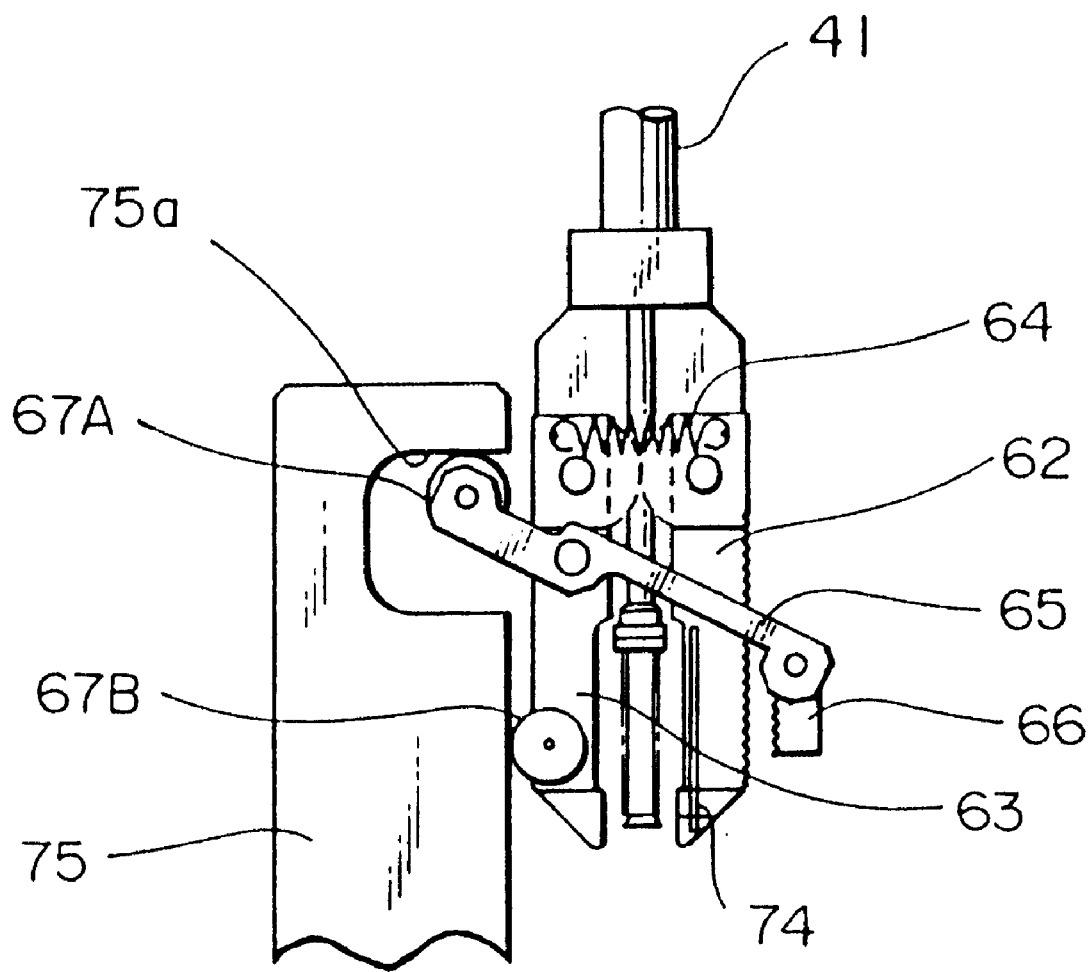
FIG. 26 is an illustration available for describing a separation adjusting method for a pusher of the FIG. 25 mounting/demounting head.
Figure 27:
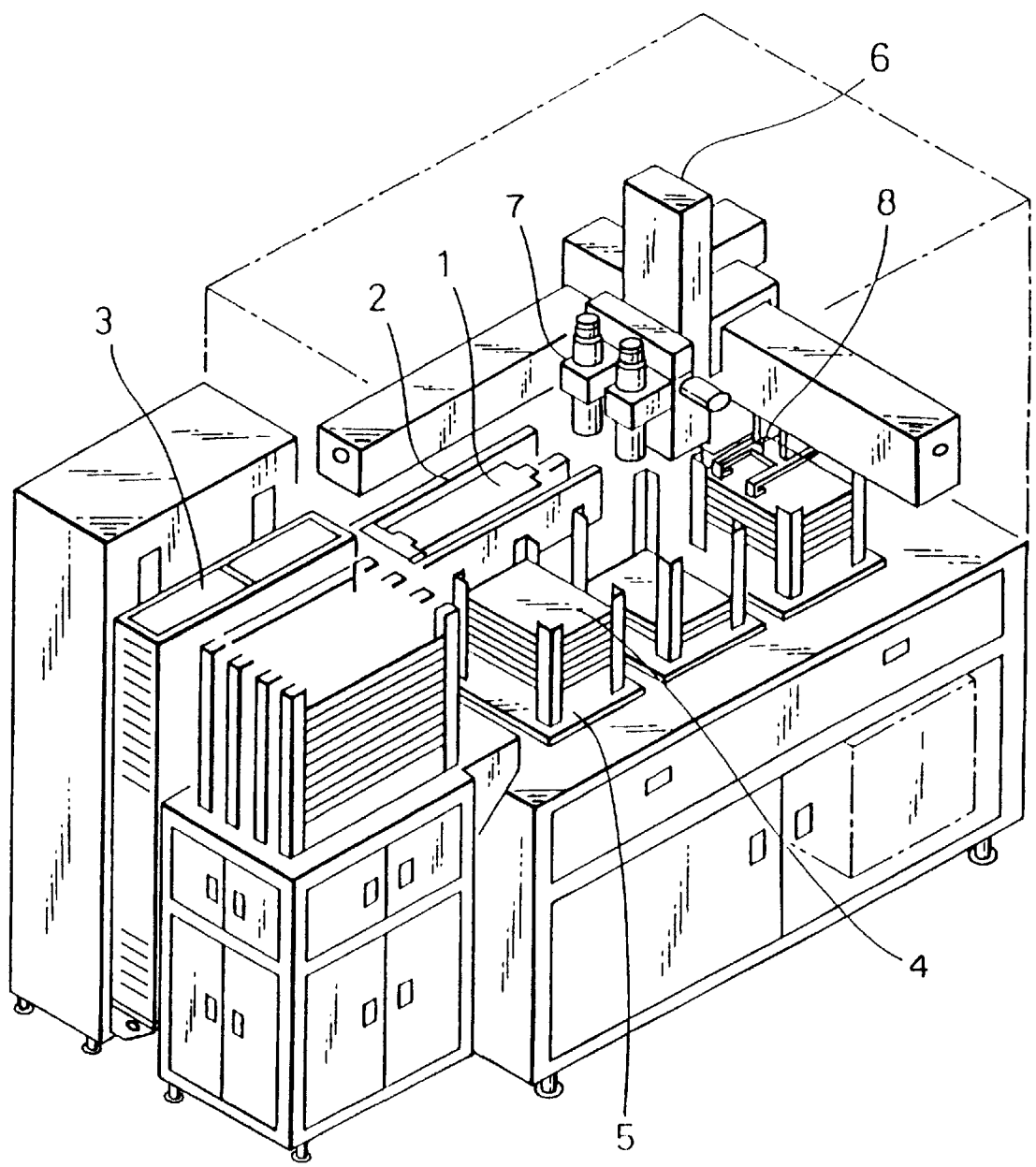
FIG. 27 is a perspective view showing one example of prior IC mounting/demounting systems.

In the case of this mounting/demounting head, the second roller 67B is pressed against a positioning member 75 as shown in FIG. 26 in a state where the centering tool 70 is in the released state and the mounting/demounting head is moved up and down in a state where the first roller 67A is brought into contact with a positioning surface 75a, with the result that the opening degree between the first and second socket pushers 62, 63 is adjustable to the size of the IC socket 1A.

Furthermore, since the defective indication detecting sensor 74 is attached to the first socket pusher 62, with the adjustment of the opening degree between the socket pushers 62, 63 it is adjusted to the position corresponding to the size of the IC socket 1A without a specific operation.

Incidentally, although the mounting/demounting head with the centering tool 70 has been described in the second embodiment, the centering tool 70 may also be omitted.

Still further, although the above-mentioned example includes the burn-in process, the system according to this invention is also applicable in terms of the electrical operation tests before and after the burn-in process if the mounting/demounting of the IC to and from the IC socket is necessary.

What is claimed is:

1. An IC mounting/demounting system comprising:
    a tray supply section for supplying a tray which bears a plurality of IC's thereon;
    a socket board supply section for supplying a socket board having a plurality of IC sockets to and from which IC's can be mounted and demounted by pressing and displacement of a movable section of each socket;
    a robot body for transferring IC's between said tray supplied to said tray supply section and said socket board supplied to said socket board supply section;
    a mounting/demounting head including a head body supported by said robot body for sucking and holding an IC, and a centering tool detachably supported by said head body and including a centering recess portion for centering an IC and a socket pusher integrally formed with said centering recess portion for pressing said movable section of one of said sockets of said socket board;
    a centering tool stocker on which a plurality of centering tools having different sizes are mountable; and
    a control section for controlling said robot body.

2. An IC mounting/demounting system as defined in claim 1, wherein information about the kind of IC is input into said control section so that said centering tool suitable for said IC is automatically selected and the current centering tool is replaced with the selected centering tool.

3. An IC mounting/demounting system as defined in claim 1, wherein said socket board supply section is a socket board table equipped with a socket board bearer made to support two socket boards and rotatable 180 degrees in a horizontal plane.

4. An IC mounting/demounting system as defined in claim 3, further comprising a socket board rack equipped with a plurality of socket board storage shelves each having a notch portion for preventing interference with said socket board bearer and said socket boards at rotation of said socket board bearer, said socket board rack supporting, on said socket board storage shelves, a plurality of socket boards to be supplied to said socket board supply section.

5. A mounting/demounting head of an IC mounting/demounting system comprising:

a head body supported by a robot body for sucking and holding an IC; and a centering tool detachably supported by said head body and including a socket pusher for pressing a movable portion of an IC socket at mounting and demounting of an IC to and from said IC socket and a centering recess portion integrally formed with said socket pusher for centering an IC.

6. A mounting/demounting head of an IC mounting/demounting system as defined in claim 5, further comprising a lever rotatably fitted to said head body and provided with a chuck claw for holding said centering tool and an air cylinder for rotating said lever to open and close said chuck claw.

7. A mounting/demounting head of an IC mounting/demounting system as defined in claim 5, wherein a wall surface of said centering recess portion is mirror-finished.

8. An IC mounting/demounting system comprising:

a tray supply section for supplying a tray which bears a plurality of IC's thereon;

a socket board supply section for supplying a socket board having a plurality of IC sockets;

a robot body for transferring IC's between said tray supplied to said tray supply section and said socket board supplied to said socket board supply section;

a mounting/demounting head supported by said robot body and including a suction mechanism for sucking and holding an IC and a defective indication detecting sensor for detecting a defective indication attached to an IC socket of said socket board and movable to enable its position with respect to said suction mechanism to be adjusted in accordance with a size of said IC socket; and a control section for controlling said robot body.

9. An IC mounting/demounting system as defined in claim 8, wherein said mounting/demounting head is equipped with a moving member supporting said defective indication detecting sensor, a spring for biasing said moving member, and a lock member for locking the movement of said moving member, and a sensor positioning member is provided within an operating range of said robot body, with said sensor positioning member having a positioning surface for restricting the movement of said moving member due to said spring when said lock member releases said moving member.

10. An IC mounting/demounting system as defined in claim 8, wherein said mounting/demounting head is equipped with a pair of socket pushers, a separation between said socket pushers being adjustable in accordance with a size of said IC socket, said mounting/demounting head being movable by said robot body to press said socket pushers against a movable portion of said IC socket at mounting and demounting of said IC to and from said IC socket, said defective indication detecting sensor being attached to one of said socket pushers.

11. An IC mounting/demounting system as defined in claim 8, wherein said moving member is linearly movable on said mounting/demounting head.

* * * * *